US006670096B2

(12) United States Patent
Kawamura et al.

(10) Patent No.: US 6,670,096 B2
(45) Date of Patent: *Dec. 30, 2003

(54) BASE MATERIAL FOR LITHOGRAPHIC PRINTING PLATE AND LITHOGRAPHIC PRINTING PLATE USING THE SAME

(75) Inventors: Koichi Kawamura, Shizuoka (JP); Miki Takahashi, Shizuoka (JP); Sumiaki Yamasaki, Shizuoka (JP); Tadahiro Sorori, Shizuoka (JP)

(73) Assignee: Fuji Photo Film Co., Ltd., Minami Ashigara (JP)

( * ) Notice: Subject to any disclaimer, the term of this patent is extended or adjusted under 35 U.S.C. 154(b) by 16 days.

This patent is subject to a terminal disclaimer.

(21) Appl. No.: 09/998,139

(22) Filed: Dec. 3, 2001

(65) Prior Publication Data

US 2002/0106583 A1 Aug. 8, 2002

(30) Foreign Application Priority Data

Dec. 1, 2000 (JP) ........................................ 2000-367208
Mar. 22, 2001 (JP) ........................................ 2001-083103

(51) Int. Cl.$^7$ .................................................. G03F 7/09

(52) U.S. Cl. ............................... 430/271.1; 430/281.1; 430/495.1; 430/523; 101/453

(58) Field of Search ........................... 430/270.1, 271.1, 430/302, 348, 401, 434, 495.1, 496, 523, 944, 945, 964, 281.1, 286.1, 287.1, 288.1; 101/130, 453, 463.1, 465, 466, 467; 428/195

(56) References Cited

U.S. PATENT DOCUMENTS

| | | | | | |
|---|---|---|---|---|---|
| 4,458,005 | A | | 7/1984 | Mohr et al. | |
| 5,807,659 | A | * | 9/1998 | Nishimiya et al. | 430/302 |
| 6,114,089 | A | * | 9/2000 | Takita et al. | 430/278.1 |
| 6,410,202 | B1 | * | 6/2002 | Fleming et al. | 430/270.1 |
| 6,509,132 | B1 | * | 1/2003 | Oohashi et al. | 430/270.1 |
| 2001/0019760 | A1 | * | 9/2001 | Kawamura | 428/195 |
| 2002/0023565 | A1 | * | 2/2002 | Kawamura et al. | 101/453 |
| 2002/0142247 | A1 | * | 10/2002 | Kawamura et al. | 430/270.1 |
| 2003/0008223 | A1 | * | 1/2003 | Kawamura et al. | 430/7 |

FOREIGN PATENT DOCUMENTS

| | | | |
|---|---|---|---|
| EP | 0 601 240 | A1 | 6/1994 |
| EP | 0 703 500 | A1 | 3/1996 |
| JP | 60-52392 | A | 3/1985 |
| WO | WO 98/52767 | A1 | 11/1998 |

* cited by examiner

*Primary Examiner*—Janet Baxter
*Assistant Examiner*—Barbara Gilliam
(74) *Attorney, Agent, or Firm*—Burns, Doane, Swecker & Mathis, LLP

(57) ABSTRACT

A base material for a lithographic printing plate comprising a support, a hydrophilic organic polymer compound that is chemically bonded to a surface of the support, and an ionic compound that is ionically bonded to the hydrophilic organic polymer compound; and a lithographic printing plate comprising the base material and an image forming layer provided thereon.

10 Claims, No Drawings

BASE MATERIAL FOR LITHOGRAPHIC PRINTING PLATE AND LITHOGRAPHIC PRINTING PLATE USING THE SAME

FIELD OF THE INVENTION

The present invention relates to a novel base material for a lithographic printing plate and a novel lithographic printing plate using the same. More particularly, it relates to a base material suitable for using in both positive working and negative working lithographic printing plates excellent in sensitivity and stain-preventing property, and to a lithographic printing plate suitable for imaging with a laser beam.

BACKGROUND OF THE INVENTION

As a hydrophilic support used in a lithographic printing plate, an anodized aluminum support and a support obtained by subjecting an anodized aluminum support to a treatment with an undercoating agent, such as silicate, polyvinyl phosphonic acid (described in JP-A-7-1853, the term "JP-A" as used herein means an "unexamined published Japanese patent application") and polyvinyl benzoic acid, for increasing the hydrophilicity have been employed. Investigations of hydrophilic supports using aluminum support have been earnestly carried out. JP-A-59-101651 discloses a technique using a polymer having a sulfonic acid group as an undercoating layer of a photosensitive layer.

With respect to a hydrophilic layer for the case where a flexible support, such as PET (polyethylene terephthalate) and cellulose acetate, is used instead of a metallic support like aluminum, such techniques have been known as a swelling hydrophilic layer comprising a hydrophilic polymer and a hydrophobic polymer described in JP-A-8-292558, a PET support having a microporous hydrophilic crosslinked silicate surface described in EP 0,709,228, and a hydrophilic layer containing a hydrophilic polymer and being hardened with tetraalkyl orthosilicate described in JP-A-8-272087 and JP-A-8-507727.

These hydrophilic layers provide a lithographic printing plate that provides printed matter without stain in the initial stage of printing. From the practical standpoint, however, a lithographic printing plate that has high sensitivity and excellent printing durability under severer printing conditions and can provide printed matter without stain has been demanded.

As a photosensitive lithographic printing plate, a so-called PS plate has been widely used, which has such a constitution that a lipophilic photosensitive resin layer is provided on a hydrophilic support. In a plate-making process thereof, it is usual that after mask exposure (plane exposure) through a lith film, a non-image part is dissolved and removed to obtain a printing plate.

In recent years, digitalization technologies have been widely spread, by which image information is electronically processed, accumulated and output using computers. Various kinds of new image output methods have been practically used corresponding to the digitalization technologies. As a result, a computer-to-plate (CTP) technique is demanded, in which a printing plate is directly produced by scanning with light having high directivity, such as a laser beam, according to image information without using a lith film, and it is an important technical task to obtain a photosensitive lithographic printing plate adapted to such a technique.

As an example of the photosensitive lithographic printing plate capable of being subjected to scanning exposure, such a product is proposed and commercially available that has a hydrophilic support having thereon a lipophilic photosensitive resin layer (hereinafter, sometimes referred to as a photosensitive layer) containing a photosensitive compound capable of generating an active species, such as a radical or a Bronsted acid, upon laser exposure. The photosensitive lithographic printing plate is subjected to laser scanning according to digital information to form an active species, and physical or chemical change is induced in the photosensitive layer owing to the action of the active species to insolubilize or solubilize the photosensitive layer. The printing plate is then subjected to a developing treatment to obtain a negative working or positive working lithographic printing plate.

In particular, a negative working photosensitive lithographic printing plate, which has a hydrophilic support having provided thereon a photopolymerizable photosensitive layer containing a photopolymerization initiator excellent in photosensitivity, an addition polymerizable ethylenically unsaturated compound and a polymer binder soluble in an alkali developing solution, and if desired, a protective layer having a function of blocking oxygen, is expected to be a printing plate having the desired printing performance owing to such advantages as excellent productivity, easiness in developing treatment and good resolution and thickening property. However, further improvements of printing performance, particularly improvements in sensitivity and printing durability have been demanded.

SUMMARY OF THE INVENTION

An object of the invention is to solve the problems accompanied with conventional techniques and specifically, to provide a base material for a lithographic printing plate that has high sensitivity, is excellent in printing durability under severe printing conditions, causes no stain on resulting printed matter, and has high hydrophilicity on the surface thereof.

Another object of the invention is to provide a photosensitive lithographic printing plate that provides sufficient printing durability under an exposure condition of small irradiation energy per unit area, and has high sensitivity, and particularly to provide a photosensitive lithographic printing plate suitable for imaging with a laser beam.

A further object of the invention is to provide a photosensitive lithographic printing plate that is suitable for plate-making by direct image-formation with a laser beam having a wavelength of from 300 to 1,200 nm, and exhibits high printing durability in comparison to conventional lithographic printing plates.

These objects of the invention can be attained by the following constitutions:

(1) A base material for a lithographic printing plate comprising a support, a hydrophilic organic polymer compound that is chemically bonded to a surface of the support, and an ionic compound that is ionically bonded to the hydrophilic organic polymer compound.

(2) The base material for a lithographic printing plate as described in item (1), wherein the hydrophilic organic polymer compound is a hydrophilic chain polymer that is chemically bonded to the surface of the support at a terminal of the chain.

(3) The base material for a lithographic printing plate as described in item (1), wherein the hydrophilic organic polymer compound is a graft polymer having a main chain that is chemically bonded to the surface of the support and a hydrophilic polymer side chain.

(4) The base material for a lithographic printing plate as described in item (1), wherein the ionic compound is a cationic compound.

(5) The base material for a lithographic printing plate as described in item (1), wherein the ionic compound is an anionic compound.

(6) The base material for a lithographic printing plate as described in item (1), wherein the ionic compound is an infrared absorbing dye.

(7) The base material for a lithographic printing plate as described in item (1), wherein the ionic compound is a photopolymerization initiator.

(8) A lithographic printing plate comprising: a base material which comprises a support, a hydrophilic organic polymer compound that is chemically bonded to a surface of the support, and an ionic compound that is ionically bonded to the hydrophilic organic polymer compound; and an image forming layer whose water-solubility changes with heat.

(9) A lithographic printing plate comprising: a base material which comprises a support, a hydrophilic organic polymer compound that is chemically bonded to a surface of the support, and an ionic compound that is ionically bonded to the hydrophilic organic polymer compound; and an image forming layer whose alkali-solubility changes with heat.

(10) A lithographic printing plate comprising: a base material which comprises a support, a hydrophilic organic polymer compound that is chemically bonded to a surface of the support, and a photopolymerization initiator that is ionically bonded to the hydrophilic organic polymer compound; and a polymerizable photosensitive layer containing a compound having a radical addition polymerizable ethylenically unsaturated bond.

DETAILED DESCRIPTION OF THE INVENTION

The base material for a lithographic printing plate according to the invention will be described in detail below.

The base material according to the invention comprises a support, a hydrophilic organic polymer compound that is chemically bonded to a surface of the support, and an ionic compound that is ionically bonded to the hydrophilic organic polymer compound.

The term "surface of the support" used herein means a surface, to which a terminal of the polymer compound having a hydrophilic functional group is chemically bonded directly, or chemically bonded through a backbone polymer compound, and includes a surface of substrate for the support itself and a surface of a layer provided on the substrate.

Hydrophilic Organic Polymer Compound

The hydrophilic organic polymer compound used in the base material for a lithographic printing plate of the invention is not particularly limited as far as it is chemically bonded to the surface of the support and also is ionically bonded to an ionic compound.

While a factor for providing hydrophilicity to the hydrophilic organic polymer compound is not particularly limited, it is usual to introduce hydrophilic functional groups in the polymer.

Among them, an ionic functional group or a functional group capable of being dissociated to an ion is preferred as a group imparting hydrophilicity and having a function capable of forming an ionic bond to an ionic compound. Specifically, a sulfonic acid group, a carboxylic acid group, an alkali metal salt thereof, or an ammonium salt group is particularly preferred.

Examples of mode where the hydrophilic organic polymer compound is chemically bonded to the surface of the support include a mode where a linear polymer is chemically bonded to the surface of the support at a terminal of the polymer chain thereof, and a mode where a graft polymer having a hydrophilic polymer as a side chain is chemically bonded to the surface of the support at the backbone (main chain) thereof. The hydrophilic organic polymer compound is fixed on the surface of the support by such modes, and thus a hydrophilic surface (hereinafter sometimes referred to as a hydrophilic layer) is formed on the support.

The hydrophilic layer can be produced by various methods. For example, the hydrophilic layer is produced utilizing a method that is referred to as surface graft polymerization.

Surface Graft Polymerization

Graft polymerization is such a method that an active species is attached on a polymer compound chain, and another monomer is polymerized by the active species to form a graft polymer, and in the case where the polymer compound, to which the active species is attached, forms a solid surface, the method is referred to as surface graft polymerization.

As the surface graft polymerization that realizes the invention, known methods described in literatures can be employed. For example, a photo graft polymerization method and a plasma irradiation graft polymerization method are described as the surface graft polymerization method in *Shin-kobunshi Jikken-gaku* 10 (New Polymer Experimentation 10), p. 135, edited by The Polymer Society of Japan, Kyoritsu Shuppan Co., Ltd. (1994). A radiation graft polymerization method using a γ-ray or an electron beam is described in *Kyuchaku Gijutsu Binran* (Adsorption Technology Handbook), p. 203 and p. 695, supervised by Takeuchi, NTS Co., Ltd. (February 1999).

A specific method of the photo graft polymerization that can be used in the invention is disclosed in JP-A-63-92658, JP-A-10-296895 and JP-A-11-119413.

As a method for forming the hydrophilic layer (surface graft layer) wherein the terminal of the polymer compound chain is chemically bonded directly to the surface, in addition to the foregoing methods, there is a method in which a reactive functional group, for example, a trialkoxysilyl group, an isocyanate group, an amino group, a hydroxyl group or a carboxyl group, is attached to the terminal of the polymer compound chain, and a reaction is carried out between the reactive functional group and the functional group on the surface of the support.

The hydrophilic layer, in which the graft polymer having hydrophilic polymer side chains is chemically bonded to the surface of the support at the backbone thereof can be formed in such a manner that a functional group capable of carrying out a reaction with the functional group on the surface of the support is introduced into the backbone of the polymer to synthesize a graft polymer compound having as a graft chain a polymer chain having hydrophilic functional groups, and functional group of the graft polymer and the functional group on the surface of the support are subjected to reaction.

Production Method of Hydrophilic Layer having Graft Hydrophilic Polymer

In the case where the plasma irradiation graft polymerization method and the radiation irradiation graft polymerization method are used, the hydrophilic layer having a graft polymer can be formed according to the methods described in the foregoing literatures and Y. Ikeda, et al., *Macromolecules,* vol. 19, p. 1804 (1986). Specifically, for example, a surface of a polymer, such as PET, is treated with an electron beam to form radicals on the surface, and then the active surface is reacted with a monomer having a hydrophilic functional group, so as to obtain a hydrophilic layer. In case of using the photo graft polymerization, a photopolymerizable composition is applied to a surface of a film material and then the coating is irradiated with light while bringing it into contact with an aqueous radical polymerizable compound as described in JP-A-53-17407 and JP-A-2000-212313 in addition to the methods described in the foregoing literatures.

The hydrophilic monomer suitable for the formation of hydrophilic graft polymer chain includes a monomer having a positive charge group, for example, an ammonium group or a phosphonium group, a monomer having a negative charge group, a sulfonic acid group, a carboxylic acid group, a phosphoric acid group or a phosphonic acid group, and a monomer having an acidic group capable of being dissociated to form a negative charge. Further, a hydrophilic monomer having a nonionic group, for example, a hydroxy group, an amido group, a sulfonamido group, an alkoxy group or a cyano group may also be used. Specific examples of the hydrophilic monomer that is useful in the invention include (meth)acrylic acid or the alkali metal salt or amine salt thereof, itaconic acid or the alkali metal salt or amine salt thereof, allylamine or the hydrogen halide thereof, 3-vinylpropionic acid or the alkali metal salt or amine salt thereof, vinylsulfonic acid or the alkali metal salt or amine salt thereof, vinylstyrenesulfonic acid or the alkali metal salt or amine salt thereof, 2-sulfoethyelne (meth)acrylate or the alkali metal salt or amine salt thereof, 3-sulfopropylene (meth)acrylate or the alkali metal salt or amine salt thereof, 2-acrylamide-2-methylpropanesulfonic acid or the alkali metal salt or amine salt thereof, acid phosphoxypolyoxyethylene glycol mono(meth)acrylate, and 2-trimethylaminoethyl (meth)acrylate or the hydrogen halide thereof. Also, 2-hydroxyethyl (meth)acrylate, (meth) acrylamide, N-monomethylol (meth)acrylamide, N-dimethylol (meth)acrylamide, N-vinylpyrrolidone, N-vinylacetamide, and polyoxyethylene glycol mono(meth) acrylate are useful.

A hydrophilic layer that has a crosslinked structure and contains a hydrophilic polymer compound having a hydrophilic graft chain may be formed on the surface of a substrate for the support.

A crosslinked hydrophilic layer per se used herein includes known hydrophilic layers. Examples of the crosslinked hydrophilic layer include an organic hydrophilic layer formed by crosslinking a hydrophilic polymer having a functional group, for example, a hydroxy group, an amido group, a carboxyl group, a sulfonic acid group or the salts thereof, with a crosslinking agent, for example, a polyfunctional isocyanate, a polyfunctional epoxy or a polyfunctional aldehyde described in WO 94/23954 and JP-A-9-54429. A hydrophilic layer formed by introducing a photocrosslinkable group in a hydrophilic polymer and crosslinking with light is also disclosed.

Further, a hydrophilic layer comprising a crosslinked polymer containing a metallic colloid disclosed in WO 98/40212 and an organic and inorganic hybrid hydrophilic layer comprising a condensate of an organic hydrophilic polymer and a silane coupling agent are known.

The effect of introduction of the graft chain is exhibited in any hydrophilic layer, and particularly, it is effective to introduce in an organic crosslinked hydrophilic layer from the standpoint of production suitability.

Introduction of the graft chain into the crosslinked hydrophilic layer can be carried out by a method that is ordinarily known as a synthesis method of a graft polymer. Specifically, synthesis of a graft polymer is described in Fumio Ide, *Graft Jugo to Sono Ouyou* (Graft Polymerization and its Application), Kobunshi Kankoukai (1977) and *Shin-KobunshiJikken-Gaku2*, *Kobunshi no Gousei Hanno* (New Polymer Experimentation 2, Synthesis and Reaction of Polymers), edited by The Polymer Society of Japan, Kyoritsu Shuppan Co., Ltd., (1995).

The synthesis of a graft polymer can be basically classified into three methods, i.e., (1) a branch monomer is polymerized from a backbone polymer, (2) a branch polymer is bonded to a backbone polymer, and (3) a branch polymer is copolymerized with a monomer for a backbone polymer (a macromer method).

The hydrophilic layer can be produced by any of these three methods, and the macromer method (3) is excellent from the standpoint of production suitability and control of the film structure.

The synthesis of a graft polymer using a macromer is described in *Shin-Kobunshi Jikken-Gaku* 2, *Kobunshi no Gousei Hanno* (New Polymer Experimentation 2, Synthesis and Reaction of Polymers), edited by The Polymer Society of Japan, Kyoritsu Shuppan Co., Ltd., (1995). It is also described in detail in Yuya Yamashita, *Macromonomer no Kagaku to Kogyo* (Chemistry and Industry of Macromonomer), IPC, Ltd. (1989). Specifically, a hydrophilic macromer can be synthesized by using the hydrophilic monomer disclosed above such as acrylic acid, acrylamide, 2-acrylamido-2-methylpropanesulfonic acid or N-vinylacetamide, according to the method described in the literatures.

Among the hydrophilic macromers used in the invention, a macromer derived from a monomer containing a carboxyl group such as acrylic acid or methacrylic acid, and a sulfonic acid macromer derived from a monomer such as 2-acrylamido-2-methylpropanesulfonic acid, vinylstyrene sulfonic acid or the salts thereof are particularly useful. A macromer derived from an amide monomer such as acrylamide or methacrylamide, an amide macromer derived from an N-vinylcarboxyamide monomer such as N-vinylacetamide or N-vinylformamide, a macromer derived from a monomer having a hydroxy group such as hydroxyethyl methacrylate, hydroxyethyl acrylate or glycerol monomethacrylate, and a macromer derived from a monomer having an alkoxy group or ethyleneoxide group such as methoxyethyl acrylate, methoxypolyethylene glycol acrylate or polyethylene glycol acrylate are also used. A monomer having a polyethylene glycol chain or polypropylene glycol chain may be used for the macromer.

The useful molecular weight of the macromer is in a range of from 400 to 100,000, preferably in a range of from 1,000 to 50,000, and particularly preferably in a range of from 1,500 to 20,000. When the molecular weight is less than 400, the intended effect cannot be obtained, and when it exceeds 100,000, polymerizability with a copolymerization monomer constituting the main chain is deteriorated.

After synthesizing the hydrophilic macromer, the hydrophilic macromer and other monomer having a reactive functional group are copolymerized to synthesize a graft copolymer. Thereafter, the reactive functional group of the polymer and a crosslinking agent are reacted to effect crosslinking, or in alternative, in the case where the other monomer to be copolymerized with the macromer contains a photo crosslinking group, crosslinking is effected by using light.

In the formation of crosslinked hydrophilic layer, after coating a composition to be crosslinked on a substrate described below, crosslinking can be conducted by photopolymerization upon irradiation of the whole surface of the coated layer, for example, with an ultraviolet ray or by polymerization reaction caused by heat.

The thickness of the crosslinked hydrophilic layer is not particularly limited, and is preferably from 0.001 to 10 $g/m^2$, and more preferably from 0.01 to 5 $g/m^2$. When it is too small, the effect of hydrophilicity is not obtained, and when it is too large, adhesion to an image forming layer described hereinafter may be deteriorated, resulting in lowering the printing durability in some cases.

Substrate for Support

In the base material for a lithographic printing plate according to the invention, a substrate of the support is not particularly limited, and any material can be used as far as it is a plate-like article having dimensional stability and satisfies necessary flexibility, strength and durability. Examples thereof include paper, paper laminated with plastics (e.g., polyethylene terephthalate, polyethylene, polypropylene or polystyrene), a metal plate (e.g., aluminum, zinc or copper), a plastic film (e.g., cellulose diacetate, cellulose triacetate, cellulose propionate, cellulose butyrate, cellulose acetate butyrate, cellulose nitrate, polyethylene terephthalate, polyethylene naphthalate, polyimide, polysulfone, polyethylene, polystyrene, polypropylene, polycarbonate or polyvinylacetal), and paper or a plastic film having the foregoing metal laminated or vapor-deposited thereon. The substrate used in the invention is preferably a polyester film, engineering plastics, for example, polyethylene naphthalate or polyimide, and an aluminum plate.

The aluminum plate is a metal plate containing aluminum as the main component and has dimensional stability, and it is selected from a pure aluminum plate, an alloy plate containing aluminum as the main component and a slight amount of foreign elements, and a plastic film or paper having aluminum or an aluminum alloy laminated or vapor-deposited thereon.

In the following description, a substrate formed from aluminum or an aluminum alloy is collectively referred to as an aluminum substrate. Examples of the foreign element contained in the aluminum alloy include silicon, iron, manganese, copper, magnesium, chromium, zinc, bismuth, nickel and titanium. The content of the foreign element in the alloy is 10% by weight or less. While a pure aluminum plate is preferably used in the invention, those containing a slight amount of foreign elements may be used because completely pure aluminum is difficult to be obtained from the standpoint of refining technique.

The aluminum plate applied to the invention is not limited in the composition thereof, and known materials, for example, JIS A1050, JIS A1100, JIS A3103 or JIS A3005 can be appropriately used. A thickness of the aluminum substrate used in the invention is approximately from 0.1 to 0.6 mm. The thickness can be appropriately changed depending on a size of printing machine, a size of printing plate and the demand of user. The aluminum substrate may be subjected to a surface treatment described hereinafter, if desired. The treatment may not be carried out.

Surface Property of Substrate

The substrate used for forming the hydrophilic surface with the graft polymer preferably has a surface, on which the hydrophilic surface is to be formed, having been roughened from the standpoint of formation of the hydrophilic surface and adhesion to a photosensitive layer formed thereon. Examples of preferred surface property of the surface of the substrate (solid surface) used in the invention is described below.

A preferred state of roughening of the substrate used in the invention includes such two-dimensional roughness parameters as a center line average roughness (Ra) of from 0.1 to 1 μm, a maximum height (Ry) of from 1 to 10 μm, a ten-point average roughness (Rz) of from 1 to 10 μm, an average interval of unevenness (Sm) of from 5 to 80 μm, an average interval of local peaks (S) of from 5 to 80 μm, a maximum height (Rt) of from 1 to 10 μm, a center line peak height (Rp) of from 1 to 10 μm and a center line valley depth (Rv) of from 1 to 10 μm. At least one of the parameters is preferably satisfied, and it is more preferred that all the parameters be satisfied.

The two-dimensional roughness parameters are based on the following definitions.

Center line average roughness (Ra): The roughness curve is sampled in a part of a measuring length of L in the direction of the center line, and an arithmetic average of the absolute values of deviations between the sampled center line and the roughness curve is designated as the center line average roughness (Ra).

Maximum height (Ry): The roughness curve is sampled in a standard length in the direction of the average line, and a value obtained by measuring the distance between the peak line and the valley line of the sampled part in the direction of the longitudinal magnification of the roughness curve is designated as the maximum height (Ry).

Ten-point average roughness (Rz): The roughness curve is sampled in a standard length in the direction of the average value thereof, and a sum in terms of micrometer (μm) of an average value of absolute values of the elevations of the highest peak to the fifth peak (Yp) and an average value of absolute values of the elevations of the lowest valley to the fifth valley (Yv), both of which are measured from the average line of the sampled length in the direction of the longitudinal magnitude, is designated as the ten-point average roughness (Rz).

Average interval of unevenness (Sm): The roughness curve is sampled in a standard length in the direction of the average line thereof. A sum of average lines corresponding to one peak and one valley adjacent thereto in the sampled part is obtained, and an arithmetic average of the distances of a large number of unevenness in terms of millimeter (mm) is designated as the average interval of unevenness (Sm).

Average interval of local peaks (S): The roughness curve is sampled in a standard length in the direction of the average line thereof. A length of the average line corresponding to the distance between the adjacent local peaks in the sample part is obtained, and an arithmetic average of the distances of a large number of local peaks in terms of millimeter (mm) is designated as the average interval of local peaks (S).

Maximum height (Rt): The roughness curve is sampled in a standard length, and the distance between two straight lines sandwiching the sampled part in parallel to the center line of the sample part is designated as the maximum height (Rt).

Center line peak height (Rp): The roughness curve is sampled in a measured length L in the direction of the center line, and the distance to a straight line passing through the highest peak in parallel to the center line of the sampled part is designated as the center line peak height (Rp).

Center line valley depth (Rv): The roughness curve is sampled in a measured length L in the direction of the center line, and the distance to a straight line passing through the lowest valley in parallel to the center line of the sampled part is designated as the center line valley depth (Rv).

In order to fix the hydrophilic organic compound on a surface of the substrate by the surface graft polymerization, it is preferred that the surface of the substrate is rendered to be that suitable for surface grafting. The surface of the substrate suitable for surface grafting may be any form as far as it exhibits such a function, and for example, it maybe either inorganic or organic. The polarity of the surface of the substrate may be either hydrophilic or hydrophobic. The surface of the substrate can exhibit the function through surface treatment.

In the case where the hydrophilic polymer is synthesized by a photo graft polymerization method, a plasma irradiation graft polymerization method or a radiation irradiation graft polymerization method, an organic surface is preferred, and in particular, the surface of an organic polymer is preferred. As the organic polymer, either a synthetic resin, for example, an epoxy resin, an acrylic resin, a urethane resin, a phenol resin, a styrene resin, a vinyl resin, a polyester resin, a polyamide resin, a melamine resin or a formalin resin, or a natural resin, for example, gelatin, casein, cellulose or starch. In the photo graft polymerization method, plasma irradiation graft polymerization method and radiation irradiation graft polymerization method, since the graft polymerization is initiated by withdrawal of a hydrogen atom of the organic polymer, it is preferred to use a polymer, from which a hydrogen atom is liable to be withdrawn, particularly an acrylic resin, a urethane resin, a styrene resin, a vinyl resin, a polyester resin, a polyamide resin and an epoxy resin, from the standpoint of production suitability.

An acrylic resin, a urethane resin, a styrene resin, a polyester resin, a polyamide resin and an epoxy resin are particularly preferred.

Ionic Compound

The ionic compound that is ionically bonded to the hydrophilic organic polymer compound chemically bonded to the surface of the support used in the base material for a lithographic printing plate according to the invention is not particularly limited and can be appropriately selected depending on the mode of the lithographic printing plate original form having a desired image formation mechanism. The ionic compound may be either a cationic compound or an anionic compound. In the case where the hydrophilic organic polymer compound bonded to the surface of the support is an anionic compound, the ionic compound is preferably a cationic compound, and in the case where the hydrophilic organic polymer compound is a cationic compound, the ionic compound is preferably an anionic compound.

Specific examples thereof include an infrared absorbing dye (IR absorbing dye) as a photothermal conversion agent, a polymerization initiator, a monomer component and an electrophilic agent.

An IR absorbing dye will be described below as a representative.

Examples of the IR absorbing dye that can be used in the invention include those capable of absorbing an ultraviolet ray, a visible ray, an infrared ray and white light and converting to heat. A dye and a pigment each capable of effectively absorbing an infrared ray having a wavelength of from 760 to 1,200 nm are particularly preferred.

The dye and the pigment used in the invention have a positive or negative charge, and the chemical structure thereof is not particularly limited.

Commercially available dyes and known dyes disclosed in literatures, for example, *Senryo Binran* (Dye Handbook), edited by The Society of Synthetic Organic Chemistry, Japan (1970) can be used as the dye. Specific examples thereof include an azo dye, a metal complex azo dye, a pyrazolone azo dye, ananthraquinone dye, aphthalocyanine dye, a carbonium dye, a quinoneimine dye, a methine dye, a cyanine dye and a metal thiolate complex. Preferred examples of the dye include a cyanine dye disclosed, e.g., in JP-A-58-125246, JP-A-59-84356, JP-A-59-202829 and JP-A-60-78787, a methine dye disclosed, e.g., in JP-A-58-173696, JP-A-58-181690 and JP-A-58-194595, a naphthoquinone dye disclosed, e.g., in JP-A-58-112793, JP-A-58-224793, JP-A-59-48187, JP-A-59-73996, JP-A-60-52940 and JP-A-60-63744, a squalirium dye disclosed, e.g., in JP-A-58-112792, and a cyanine dye disclosed in British Patent 434,875.

A near infrared absorbing sensitizer disclosed in U.S. Pat. No. 5,156,938 is preferably used, and a substituted arylbenzo(thio)pyrylium salt disclosed in U.S. Pat. No. 3,881,924, a trimethinethiapyrylium salt disclosed in JP-A-57-142645 (U.S. Pat. No. 4,327,169), a pyrylium compound disclosed in JP-A-58-181015, JP-A-58-220143, JP-A-59-41363, JP-A-59-84248, JP-A-59-84249, JP-A-59-146063 and JP-A-59-146061, a cyanine dye disclosed in JP-A-59-216146, a pentamethinethiopyrylium salt disclosed in U.S. Pat. No. 4,283,475, and a pyrylium compound disclosed in JP-B-5-13514 and JP-B-5-19702 are also preferably used. Examples of other preferred dye include near infrared absorbing dyes represented by formulae (I) and (II) in U.S. Pat. No. 4,756,993. Particularly preferred examples thereof include a cyanine dye, a squalirium dye, a pyrylium salt and a nickel thiolate complex.

When a printing plate comprising a base material having an IR absorbing dye, which is a photothermal conversion agent, ionically bonded as the ionic compound, and an image forming layer, water solubility of which changes with heat (water insolubility changes to water solubility in a positive-working type, and on the other hand, water solubility changes to water insolubility in a negative-working type) is subjected to imagewise exposure, the change of water solubility occurs at an interface between the base material and the image forming layer, and thus the change in water solubility in the exposed area is not necessarily exerted throughout the thickness of the image forming layer. The energy for imagewise exposure is sufficient when it causes the change at the interface between the base material and the image forming layer. As a result, image formation can be carried out with a smaller amount of energy than that changes the whole thickness of the image forming layer in the exposed area. In other words, the printing plate has high sensitivity.

Hydrophilicity of a non-image area, which is formed by removing the image forming layer in a changed part (for a positive-working type) or a non-changed part (for a negative-working type) in water solubility with an aqueous solution, for example, dampening water, is derived from the hydrophilic organic polymer compound bonded to the surface of the support. Because the hydrophilic organic polymer compound is chemically bonded to the surface of the support, the compound is hardly released under severe printing conditions in comparison to the case where it is simply provided by coating, and thus the occurrence of stain on printed matter is prevented.

Even in the case where a material having high thermal conductivity such as aluminum is used as the substrate for the support, the hydrophilic organic polymer compound functions as a heat insulating material, and heat energy formed by photothermal conversion can be effectively utilized without escaping to the substrate. That is, high sensitivity can be obtained.

On the contrary, when a lithographic printing plate comprising a base material having the hydrophilic organic polymer compound that is not bonded to an IR absorbing dye, and an image forming layer containing an IR absorbing dye, is exposed imagewise, the water solubility of which changes with heat, the change of the water solubility of the image forming layer is started from the surface thereof and proceeds toward the base material. In this case, when the energy of imagewise exposure is insufficient, the image forming layer in the exposed portion is not sufficiently removed to form a non-image area in the case of the positive-working type, or the image forming layer in the exposed portion is not sufficiently rendered to insoluble in the case of the negative-working type, whereby the vicinity of the interface between the image forming layer and the base material in the exposed portion is dissolved with an aqueous solution, for example, dampening water, to fail to form an image area.

Furthermore, it is difficult that the IR absorbing dye is directly adsorbed on the surface of the support without the hydrophilic organic polymer compound chemically bonded to the surface of the support according to the invention.

In the case where a lithographic printing plate is produced by using the base material according to the invention, an image forming layer formed on the base material can be appropriately selected depending on the mode of the lithographic printing plate having a desired image formation mechanism, and the image forming layer corresponding to the function of the ionic compound can be appropriately selected.

Important examples thereof include a photosensitive or heat-sensitive layer containing a polymer compound having a functional group changing the hydrophilicity and hydrophobicity, and a positive-working or negative-working photosensitive layer known in the field of a conventional PS plate and photoresist.

The image forming layer containing the polymer compound having a functional group (polarity converting group) changing the hydrophilicity and hydrophobicity thereof by heat, an acid or radiation will be described.

The polarity converting group includes two kinds of functional groups, i.e., a functional group changing from hydrophobicity to hydrophilicity and a functional group changing from hydrophilicity to hydrophobicity.

<Polymer Having Functional Group Changing From Hydrophobicity to Hydrophilicity on Side Chain>

Of the polymers having a side chain changing hydrophilicity and hydrophobicity, examples of the polymer having a functional group changing from hydrophobicity to hydrophilicity on the side chain thereof include a sulfonate polymer and sulfonamide disclosed in JP-A-10-282672 and a carboxylate polymer disclosed in European Patent 652, 483, JP-A-6-502260 and JP-A-7-186562.

Of the polymers having a side chain changing from hydrophobicity to hydrophilicity, a secondary sulfonate polymer, a tertiary carboxylate polymer and an alkoxyalkyl carboxylate polymer are particularly preferred.

Specific examples of the sulfonate polymer ((1p-1) to (1p-8)) and the carboxylate polymer ((a1) to (a10)) are illustrated below, but the invention should not be construed as being limited thereto.

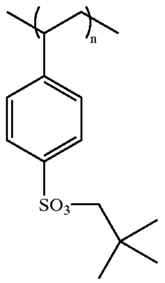
(1p-1)

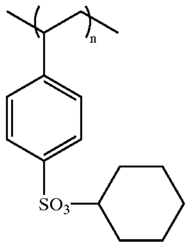
(1p-2)

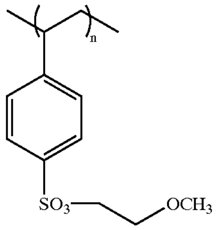
(1p-3)

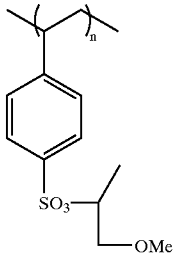
(1p-4)

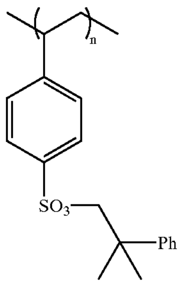
(1p-5)

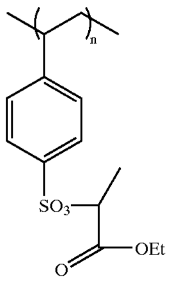
(1p-6)

-continued (1p-7)

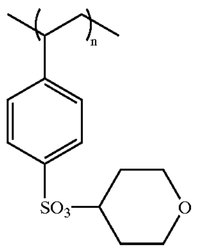

(1p-8)

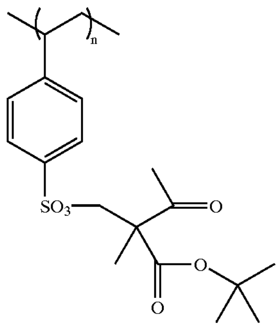

(a1)

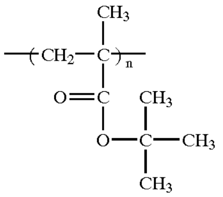

(a2)

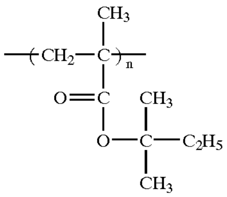

(a3)

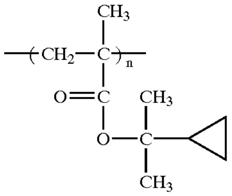

(a4)

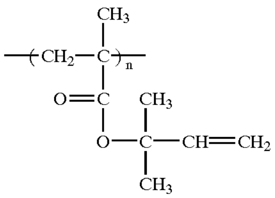

(a5)

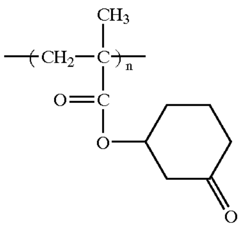

-continued (a6)

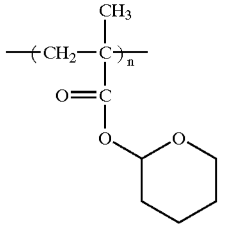

(a7)

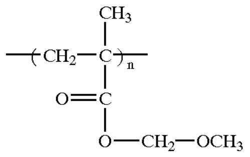

(a8)

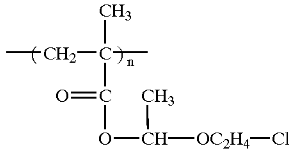

(a9)

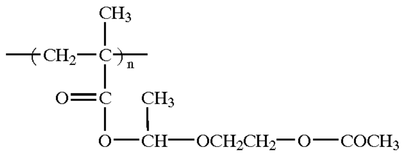

(a10)

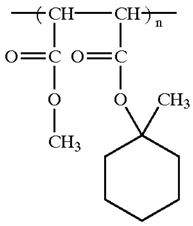

In the case where the sulfonate polymer or carboxylate polymer is used in the invention, the amount thereof is ordinarily approximately from 5 to 99% by weight, preferably from 10 to 98% by weight, and more preferably from 30 to 90% by weight, based on the total solid content of the image forming layer (a photosensitive layer or a heat-sensitive layer).

Specific examples of the polymer having a functional group changing from hydrophilicity to hydrophobicity on the side chain include a polymer having an ammonium base disclosed in JP-A-6-317899 and a polymer having a decarboxylation type polarity conversion group represented by formula (I) described below, for example, sulfonyl acetic acid as disclosed in JP-A-2000-309174.

(I)

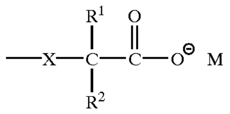

wherein X represents —O—, —S—, —Se—, —$NR^3$—, —CO—, —SO—, —$SO_2$—, —PO—, —$SiR^3R^4$— or —CS—, $R^1$, $R^2$, $R^3$ and $R^4$ each independently represents a monovalent group, and M represents an ion having a positive charge.

Specific examples of each of $R^1$, $R^2$, $R^3$ and $R^4$ include —F, —Cl, —Br, —I, —CN, —$R^5$, —$OR^5$, —$OCOR^5$, —OC $OOR^5$, —$OCONR^5R^6$, —$OSo_2R^5$, —$COR^5$, —$COOR^5$, —$CONR^5R^6$, —$NR^5$ $R^6$, —$NR^5$—$COR^6$, —$NR^5$—$COOR^6$, —$NR^5$—$CONR^6R^7$, —$SR^5$, —$SOR^5$, —$SO_2R^5$ and —$SO_3R^5$.

Specific examples of each of $R^5$, $R^6$ and $R^7$ include a hydrogen atom, an alkyl group, an aryl group, an alkenyl group and an alkynyl group.

$R^1$, $R^2$, $R^3$ and $R^4$ each preferably represents a hydrogen atom, an alkyl group, an aryl group, an alkynyl group and alkenyl group.

The polarity conversion polymer compound in the invention may be either a homopolymer of one kind of the monomer having the hydrophilic functional group or a copolymer of two or more kinds thereof. Furthermore, it may be a copolymer with other monomers as far as the effect of the invention is not impaired.

Specific examples of the other monomers used for synthesizing the polarity conversion polymer compound include those compounds having an ethylenically unsaturated double bond described in the foregoing.

The proportion of the other monomers used for synthesizing the copolymer is not particularly limited as far as the hydrophilicity of the polymer compound is changed to hydrophobicity due to heat, and is preferably 80% by weight or less, and more preferably 50% by weight or less.

The polarity conversion polymer compound can be produced by known methods, for example, those described in *Kobunshi Kagaku* (Polymer Chemistry), vol. 7, p. 142 (1950). While the polarity conversion polymer compound may be either a random polymer, a block polymer or a graft polymer, it is preferably a random polymer. The polymer is synthesized by radical polymerization using a polymerization initiator, for example, a peroxide, e.g., di-t-butyl peroxide and benzoyl peroxide, a persulfate, e.g., ammonium persulfate, and an azo compound, e.g., azobisisobutyronitrile, while appropriately selected depending on the polymerization method. Examples of the polymerization method include solution polymerization, emulsion polymerization and suspension polymerization. The polymerization degree of the polarity conversion polymer compound is not particularly limited.

Examples of a solvent used in the synthesis of polarity conversion polymer compound include teterahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, ethyl lactate, methyl lactate, dimethyl sulfoxide and water. These solvents may be used solely or as a mixture of two or more thereof.

Specific examples of the polarity conversion polymer compound are described below, but the invention should not be construed as being limited thereto.

P-1

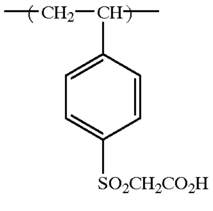

-continued

P-2

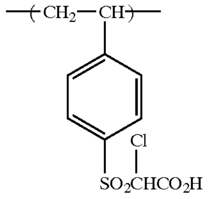

P-3

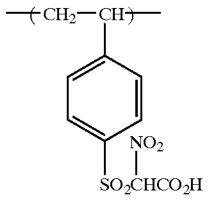

P-4

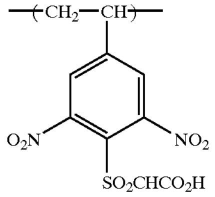

P-5

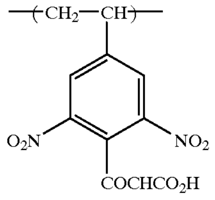

P-6

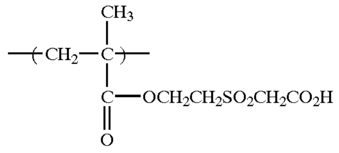

P-7

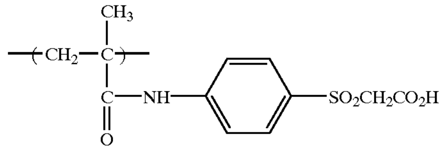

P-8

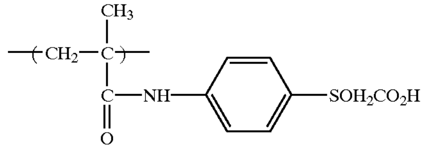

P-9

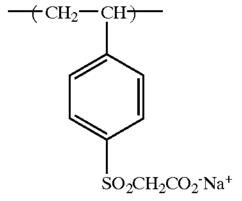

-continued

P-10

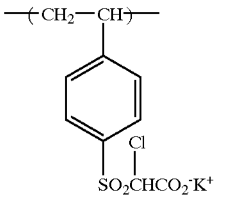

P-11

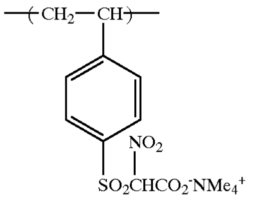

P-12

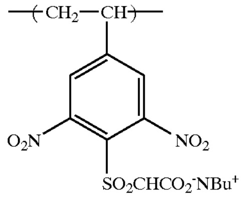

P-13

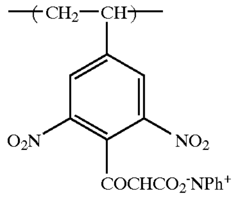

P-14

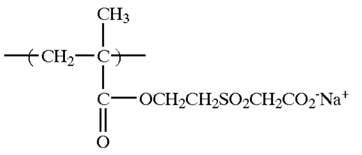

P-15

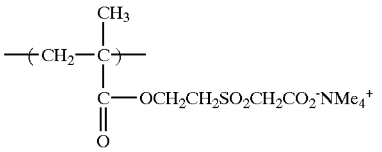

P-16

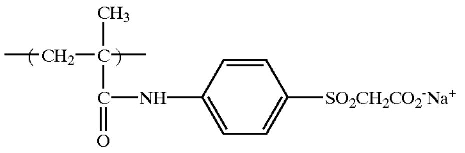

P-17

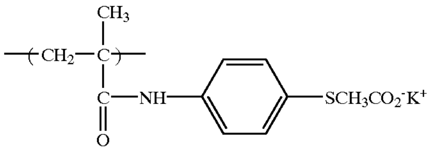

The proportion of the polarity conversion polymer compound in the total solid content in the image forming layer is preferably from 0 to 94% by weight, and more preferably from 0.05 to 90% by weight.

<Positive-Working Photosensitive Layer Composition>

As the positive-working photosensitive layer composition, the following known positive-working photosensitive layer compositions (a) and (b) are preferably used.

(a) A conventional positive-working photosensitive composition conventionally used containing naphthoquinone diazide and a novolak resin.

(b) A chemical amplifying positive-working photosensitive composition containing a combination of an alkali soluble compound protected with an acid decomposable group and an acid generator.

The compositions (a) and (b) are well known in the art, and it is more preferred that the following positive-working photosensitive compositions (c) to (f) are used in combination.

(c) A laser-sensitive positive-working composition containing a sulfonate polymer capable of producing a lithographic printing plate without a developing treatment as described in JP-A-10-282672.

(d) A laser-sensitive positive-working composition containing a carboxylate polymer capable of producing a lithographic printing plate without a developing treatment as described in European Patent 652,483 and JP-A-6-502260.

(e) A laser-sensitive positive-working composition containing an alkali soluble compound and a heat-decomposable substance that substantially lowers solubility of the alkali soluble compound, when it is not decomposed, as described in JP-A-11-95421.

(f) An alkali development dissolution type positive-working composition containing an infrared absorbent, a novolak resin and a dissolution suppressing agent, capable of producing an alkali development dissolution type positive-working lithographic printing plate.

<Negative Photosensitive Layer Composition>

As the negative-working photosensitive layer composition, the following known negative-working photosensitive layer compositions (g) to (j) can be used.

(g) A negative-working photosensitive composition containing a polymer having a photocrosslinkable group and an azide compound.

(h) A negative-working photosensitive composition containing a diazo compound as described in JP-A-59-101651.

(i) A photopolymerizable negative-working photosensitive composition containing a photopolymerization initiator and a addition polymerizable unsaturated compound as described in U.S. Pat. No. 262,276 and JP-A-2-63054.

(j) A negative-working photosensitive composition containing an alkali soluble compound, an acid generator and an acid crosslinkable compound as described in JP-A-11-95421.

<Other Components>

In the image forming layer of the lithographic printing plate having the base material according to the invention, various compounds other than the foregoing may be added to obtain various characteristics of the lithographic printing plate, if desired.

In the image forming layer, a dye having large absorption in the visible region can be used as a coloring agent for an image.

Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Chemical Co., Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015) and dyes disclosed in JP-A-62-293247.

The dye is preferably added since discrimination between an image area and a non-image area becomes easier after the formation of image. The addition amount thereof is ordinarily from 0.01 to 10% by weight based on the total solid content of the image forming layer.

In order to improve the stability with respect to the developing conditions, a nonionic surface active agent disclosed in JP-A-62-251740 and JP-A-3-208514 and an amphoteric surface active agent disclosed in JP-A-59-121044 and JP-A-4-13149 may be added to the image forming layer.

Specific examples of the nonionic surface active agent include sorbitan tristearate, sorbitan monopalmitate, sorbitan trioleate, monogryceryl stearate and polyoxyethylene nonylphenyl ether.

Specific examples of the amphoteric surface active agent include alkyldi(aminoethyl)glycine, alkylpolyaminoethylglycine hydrochloride, 2-alkyl-N-carboxyethyl-N-hydroxyethylimidazolinium betaine and N-tetradecyl-N,N-betaine (for example, Amogen K, produced by Daiichi Kogyo Seiyaku Co., Ltd.). The proportion of the nonionic surface active agent and the amphoteric surface active agent used in the image forming layer is preferably from 0.05 to 15% by weight, and more preferably from 0.1 to 5% by weight.

A plasticizer may be added to the image forming layer in order to imparting flexibility to the coated film, if desired. Examples thereof include butyl phthalyl ether, polyethylene glycol, tributyl citrate, diethyl phthalate, dihexyl phthalate, dioctyl phthalate, tricresyl phosphate, tributyl phosphate, trioctyl phosphate, tetrahydrofurfuryl oleate and an oligomer and a polymer of acrylic acid or methacrylic acid.

In addition, the onium salt or haloalkyl-substituted s-triazine compound described below, an epoxy compound, a vinyl ether, or a phenol compound having a hydroxymethyl group or a phenol compound having an alkoxymethyl group described in Japanese Patent Application No. 7-18120 may be added.

The image forming layer is ordinarily formed by dissolving the components in a solvent, and then coating them on the base material for a lithographic printing plate. Examples of the solvent used herein include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylfromamide, tetramethylurea, N-methylpyrrolidone, dimethyl sulfoxide, sulfolane, γ-butyllactone, toluene and water, but the invention is not limited to them. The solvents may be used solely or as a mixture of two or more thereof. The concentration of the foregoing components (i.e., the total solid content including the additives) in the solvent is preferably from 1 to 50% by weight. The coating amount (solid content) on the base material after drying is ordinarily in a range of from 0.1 to 10 $g/m^2$, and preferably in a range of from 0.5 to 5 $g/m^2$, while it maybe varied depending on the use. When it is too small, the printing durability is deteriorated, and when it is too large, reproducibility of thin lines in the printed matter is deteriorated.

Various coating methods may be used for coating the composition, and examples thereof include bar coater coating, spin coating, spray coating, curtain coating, dip coating, air knife coating, blade coating and roll coating. As the coated amount decreases, apparent sensitivity increases, but film characteristics of the image forming layer are deteriorated.

In order to improve the coating property, a surface active agent, for example, a fluorine surface active agent disclosed in JP-A-62-170950 may be added to the image forming layer. An addition amount thereof is preferably from 0.01 to 1% by weight, and more preferably from 0.05 to 0.5% by weight, based on the total solid content in the image forming layer.

The lithographic printing plate having a photopolymerizable photosensitive layer provided on the base material according to the invention will be described in detail below.

It is well known by the person skilled in the art that sensitivity and printing durability of a photopolymerizable photosensitive material are greatly influenced by a polymerization ratio at an interface between a polymerization layer and a hydrophilic support. It is considered that the effect of the invention is exhibited because the polymerization ratio in the vicinity of hydrophilic interface is increased. Specifically, in the invention, the photopolymerization initiator present on the hydrophilic surface generates a radical by light, and the polymerization reaction in the vicinity of interface between the photosensitive layer and the hydrophilic layer proceeds dominantly in comparison with the polymerization reaction of the entire layer. The increase of the polymerization ratio near the interface brings about improvement in printing durability or improvement in sensitivity. The invention has been completed by finding out such a technique that the photopolymerization initiator is localized on the surface and such a technique that no stain occurs on a non-image area despite of the localization.

A photosensitive lithographic printing plate according to the invention comprises a base material having a hydrophilic organic polymer compound (hereinafter, sometimes referred to as a hydrophilic graft polymer) chemically bonded thereto, a photopolymerization initiator ionically bonded to the hydrophilic graft polymer, and a polymerizable photosensitive layer containing a compound having a radical addition polymerizable ethylenically unsaturated bond ring (hereinafter, sometimes simply referred to as a addition polymerizable compound). Various additives, for example, a photosensitizer, a coloring agent, a plasticizer or a polymerization inhibitor, may be added to the photosensitive layer, if desired.

The photopolymerization initiator used is a compound that generates a polymerization initiating species upon absorbing light having a wavelength of from 250 to 1,200 nm. A mechanism of the generation is not particularly limited, and may be the generation through a direct photochemical process or the generation through heat via a photothermal conversion process after the absorption of light in an infrared region. The photopolymerization initiator may be a dual initiating system comprising a combination of a photosensitizing dye and an initiator, in which the light absorbing function and the radical generating function are carried by the separate compounds. It may also be a single photoradical generator that carries both the light absorbing function and the radical generating function by itself. In the former case, it is necessary to exhibit the effect of the invention that at least one of the sensitizing dye and the initiator ionically interacts with the hydrophilic surface of the support.

Photopolymerization Initiator Capable of Interacting with Hydrophilic Graft Polymer As the photopolymerization initiator capable of interacting with the hydrophilic graft polymer, various kinds of photopolymerization initiators known in patents and literatures and a combination system of two or more kinds of the photopolymerization initiators (a photopolymerization initiating system) may be appropriately selected taking a wavelength of light source used into consideration. In the invention, it is necessary that a functional group or a structure capable of interacting with the hydrophilic graft chain is contained in a part of the structure of the photopolymerization initiator or in a part of at least one of the structures of the two components in the case of the dual photopolymerization initiating system.

Functional Group Capable of Interacting With Hydrophilic Graft Chain

The functional group capable of interacting with the hydrophilic graft chain is described below. It is necessary that the initiator contain such a functional group.

The interaction that is necessary for firmly bonding the hydrophilic graft polymer and the photopolymerization initiator includes an ionic bond, a hydrogen bond, a polar interaction and a van der Waals interaction. According to the invention, an ionic bond and a hydrogen bond are particularly preferred as the interaction because they form firm bonds without applying any special energy such as heat in view of improvement in sensitivity.

Specific examples of the functional group capable of interacting with the hydrophilic graft polymer include a basic functional group, for example, an amino group or a pyridyl group, a quaternary ammonium group, a hydroxyl group, an acidic functional group, for example, a carboxyl group or a sulfonic acid group and a hydrogen bonding functional group, for example, an amide group. The selection of the functional group used is conducted under consideration of the species of functional group of the graft polymer present on the hydrophilic surface. Specifically, it is desired that facility of interaction with the graft polymer and strength of the interaction thus formed be taken into consideration. For example, in the case where the graft polymer is an acrylic acid graft polymer, the functional group introduced into the photopolymerization initiator is preferably a functional group capable of interacting with acrylic acid, specifically, an amino group, a pyridyl group, a quaternary ammonium group or an amido group. In the case where the graft polymer is an acrylamide graft polymer, it is necessary to select a carboxyl group, which is capable of interacting with the acrylamide, as the functional group introduced into the photopolymerization initiator.

The function of interaction may be introduced in the structure of the photopolymerization initiator. For example, a cationic part or an anionic part may be incorporated into the structure of the photopolymerization initiator.

Photopolymerization Initiator

Specific examples of the photopolymerization initiator that can be used in the invention include the following. In the case where a violet semiconductor laser, an Ar laser, a second harmonic of an infrared semiconductor laser or an SHG-YAG laser is used as a light source, various kinds of photopolymerization initiators (systems) have been proposed. Examples thereof include a certain kind of a photoreducing dye, for example, Rose Bengal, Eosin or Erythrocin disclosed in U.S. Pat. No. 2,850,445, a system of a combination of a dye and an initiator, for example, a complex initiating system of a dye and an amine (JP-B-44-20189), a combination system of hexaarylbiimidazole, a radical generator and a dye (JP-B-45-37377), a system of hexaarylbiimidazole and p-dialkylaminobenzylidene ketone (JP-B-47-2528 and JP-A-54-155292), a system of a cyclic cis-α-dicarbonyl compound and a dye (JP-A-48-84183), a system of a cyclic triazine and a merocyanine dye (JP-A-54-151024), a system of 3-ketocoumarin and an activator (JP-A-52-112681 and JP-A-58-15503), a system of biimidazole, a styrene derivative and thiol (JP-A-59-140203), a system of an organic peroxide and a dye (JP-A-59-1504, JP-A-59-140203, JP-A-59-189340, JP-A-62-174203, JP-B-62-1641 and U.S. Pat. No. 4,766,055), a system of a dye and an active halogen compound (JP-A-63-1718105, JP-A-63-258903 and JP-A-3-264771), a system of a dye and a borate compound (JP-A-62-143044, JP-A-62-150242, JP-A-64-13140, JP-A-64-13141, JP-A-64-13142, JP-A-64-13143, JP-A-64-13144, JP-A-64-17048, JP-A-1-229003, JP-A-1-298348 and JP-A-1-138204), a system of a dye having a rhodanine ring and a radical generator (JP-A-2-179643 and JP-A-2-244050), a system of titanocene and a 3-ketocoumarin dye (JP-A-63-221110), a system of combining titanocene, a xanthene dye and an addition polymerizable ethylenically unsaturated compound containing an amino group or a urethane group (JP-A-4-221958 and JP-A-4-219756), a system of titanocene and a specific merocyanine dye (JP-A-6-295061), and a system of titanocene and a dye having a benzopyran ring (JP-A-8-334897).

A cationic sensitizing dye, for example, cyanine, a squalirium dye or pyrylium, and an anionic initiator, for example, a borate are particularly preferably used.

Infrared Photopolymerization Initiator

In the case where a laser emitting an infrared ray having a wavelength of from 760 to 1,200 nm is used as a light source, it is ordinarily necessary to use an infrared absorbent as a photosensitizer. The infrared absorbent has a function converting an absorbed infrared ray to heat. The radical initiator is decomposed with heat thus formed to generate a radical. The infrared absorbent used in the invention is a dye or a pigment having an absorption maximum at a wavelength of from 760 to 1,200 nm, and is preferably a cationic or anionic dye.

Commercially available dyes and known dyes described, for example, in *Senryo Binran* (Dye Handbook), edited by The Society of Synthetic Organic Chemistry, Japan, (1970) can be used as the dye. Specific examples thereof include an azo dye, a metal complex azo dye, a pyrazolone azo dye, a naphthoquinone dye, an anthraquinone dye, a phthalocyanine dye, a carbonium dye, a quinoneimine dye, a methine dye, a cyanine dye, a squalirium dye, a pyrylium dye and a metal thiolate complex.

Preferred examples of the dye include a cyanine dye disclosed, e.g., in JP-A-58-125246, JP-A-59-84356, JP-A-59-202829 and JP-A-60-78787, a methine dye disclosed, e.g., in JP-A-58-173696, JP-A-58-181690 and JP-A-58-194595, a naphthoquinone dye disclosed, e.g., in JP-A-58-112793, JP-A-58-224793, JP-A-59-48187, JP-A-59-73996, JP-A-60-52940 and JP-A-60-63744, a squalirium dye disclosed, e.g., in JP-A-58-112792, and a cyanine dye disclosed in British Patent 434,875.

A near infrared absorbing sensitizer disclosed in U.S. Pat. No. 5,156,938 is preferably used, and a substituted arylbenzo(thio)pyrylium salt disclosed in U.S. Pat. No. 3,881,924, a trimethinethiapyrylium salt disclosed in JP-A-57-142645 (U.S. Pat. No. 4,327,169), a pyrylium compound disclosed in JP-A-58-181015, JP-A-58-220143, JP-A-59-41363, JP-A-59-84248, JP-A-59-84249, JP-A-59-146063 and JP-A-59-146061, a cyanine dye disclosed in JP-A-59-216146, a pentamethinethiopyrylium salt disclosed in U.S. Pat. No. 4,283,475, and a pyrylium compound disclosed in JP-B-5-13514 and JP-B-5-19702 are also preferably used.

Examples of other preferred dye include near infrared absorbing dyes represented by formulae (I) and (II) in U.S. Pat. No. 4,756,993.

A cyanine dye, a squalirium dye and a pyrylium salt are particularly preferably used. Furthermore, a cyanine dye is particularly preferred, and a cyanine dye represented by the following formula (1) is the most preferred.

(1)

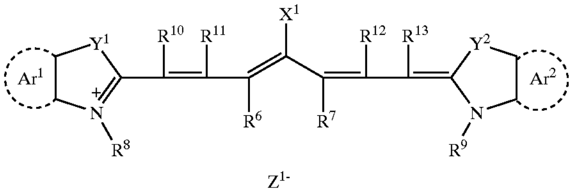

In formula (1), $X^1$ represents a halogen atom or $X^2$—$L^1$. $X^2$ represents an oxygen atom or a sulfur atom. $L^1$ represents a hydrocarbon group having from 1 to 12 carbon atoms. $R^6$ and $R^7$ each independently represents a hydrocarbon group having from 1 to 12 carbon atoms. $R^6$ and $R^7$ each is preferably a hydrocarbon group having 2 or more carbon atoms, and more preferably $R^6$ and $R^7$ are combined to each other to form a 5-membered or 6-membered ring, from the standpoint of storage stability of a coating solution for the photosensitive layer.

$Ar^1$ and $Ar^2$, which may be the same or different, each represents an aromatic hydrocarbon group which may have a substituent. Preferred examples of the aromatic hydrocarbon group include a benzene ring and a naphthalene ring. Preferred examples of the substituent include a hydrocarbon group having 12 or less carbon atoms, a halogen atom and an alkoxy group having 12 or less carbon atoms.

$Y^1$ and $Y^2$, which may be the same or different, each represents a sulfur atom or a dialkylmethylene group having 12 or less carbon atoms. $R^8$ and $R^9$, which may be the same or different, each represents a hydrocarbon group having 20 or less carbon atoms which may have a substituent. Preferred examples of the substituent include an alkoxy group having 12 or less carbon atoms, a carboxyl group and a sulfo group. $R^{10}$, $R^{11}$, $R^{12}$ and $R^{13}$, which may be the same or different, each represents a hydrogen atom or a hydrocarbon group having 12 or less carbon atoms. $R^{10}$, $R^{11}$, $R^{12}$ and $R^{13}$ are preferably hydrogen atoms from the standpoint of availability of raw materials. $Z^{1-}$ represents a counter anion, provided that in the case where a sulfo group is substituted on at least one of $R^6$ to $R^{13}$, $Z^{1-}$ is not necessary. Preferred examples of $Z^{1-}$ include a halogen ion, a perchlorate ion, a tetrafluoroborate ion, a hexafluorophosphate ion and a sulfonate ion from the standpoint of storage stability of a coating solution for the photosensitive layer, and a perchlorate ion, a hexafluorophosphate ion and an arylsulfonate ion are particularly preferred.

Examples of the initiator used in combination with the infrared absorbing dye include an onium salt, a triazine compound having a trihalomethyl group, a peroxide, an azo polymerization initiator, an azido compound and quinone diazide. An onium salt is preferred owing to high sensitivity.

Preferred examples of the onium salt include an iodonium salt, a diazonium salt and a sulfonium salt. In the invention, the onium salt functions as an initiator of radical polymerization but not as an acid generator. Preferred examples of the onium salt used in the invention include those represented by the following general formulae (2) to (4).

$$Ar^{11}—I^{+}—Ar^{12} \quad Z^{11-} \tag{2}$$

$$Ar^{12}—N^{+}\equiv N \quad Z^{21-} \tag{3}$$

-continued (4)

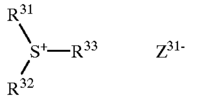

In formula (2), $Ar^{11}$ and $Ar^{12}$ each independently represents an aryl group, which may have a substituent, having 20 or less carbon atoms (including a carbon number of the substituent). Preferred examples of the substituent include a halogen atom, a nitro group, an alkyl group having 12 or less carbon atoms, an alkoxy group having 12 or less carbon atoms and an aryloxy group having 12 or less carbon atoms. $Z^{11-}$ represents a counter ion selected from the group consisting of a halogen ion, a perchlorate ion, a tetrafluoroborate ion, a hexafluorophosphate ion and a sulfonate ion, and is preferably a perchlorate ion, a hexafluorophosphate ion or an arylsulfonate ion.

In formula (3), $Ar^{21}$ represents an aryl group, which may have a substituent, having 20 or less carbon atoms (including a carbon number of the substituent). Preferred examples of the substituent include a halogen atom, a nitro group, an alkyl group having 12 or less carbon atoms, an alkoxy group having 12 or less carbon atoms, an aryloxy group having 12 or less carbon atoms, an alkylamino group having 12 or less carbon atoms, a dialkylamino group having 12 or less carbon atoms, an arylamino group having 12 or less carbon atoms and a diarylamino group having 12 or less carbon atoms. $Z^{21-}$ represents a counter ion having the same meaning as defined for $Z^{11-}$.

In formula (4), $R^{31}$, $R^{32}$ and $R^{33}$, which may be the same or different, each represents a hydrocarbon group, which may have a substituent, having 20 or less carbon atoms (including a carbon number of the substituent). Preferred examples of the substituent include a halogen atom, a nitro group, an alkyl group having 12 or less carbon atoms, an alkoxy group having 12 or less carbon atoms, and an aryloxy group having 12 or less carbon atoms. $Z^{31-}$ represents a counter ion having the same meaning as defined $Z^{11}$.

Specific examples of the onium salt that can be preferably used as the radical generator in the invention include those described in JP-A-2001-133969.

A large amount of the photopolymerization initiator used is advantageous from the standpoint of sensitivity. It is preferred that the optical density at the absorption maximum within the wavelength range of from 250 to 1,200 nm is in a range of from 0.1 to 3.0. When it deviates from the range, there is a tendency that the sensitivity is decreased. The initiator is ordinarily dissolved in a solvent, and then the solution is coated on the graft hydrophilic support or the graft hydrophilic support is subjected to dip coating using the solution, whereby the initiator is ionically bonded to the graft hydrophilic support.

Polymerizable Photosensitive Layer

The polymerizable photosensitive layer of the photosensitive lithographic printing plate according to the invention will be described below.

<Addition Polymerizable Compound>

The polymerizable photosensitive layer according to the invention contains an addition polymerizable compound having at least one ethylenically unsaturated double bond.

The addition polymerizable compound is selected from compounds having at least one, preferably two or more, terminal ethylenically unsaturated bonds. Such compounds have been well known in the field of art, and they can be used in the invention without any particular limitation. The compounds have such a chemical form as a monomer, a prepolymer, i.e., a dimer, a trimer or an oligomer, a mixture thereof or a copolymer thereof. Examples of the monomer and a copolymer thereof include an unsaturated carboxylic acid (e.g., acrylic acid, methacrylic acid, itaconic acid, crotonic acid, isocrotonic acid or maleic acid), and an ester and an amide thereof, and preferably, an ester of an unsaturated carboxylic acid and an aliphatic polyhydric alcohol compound, and an amide of an unsaturated carboxylic acid and an aliphatic polyvalent amine compound. An addition product of an unsaturated carboxylate having a nucleophilic substituent such as a hydroxyl group, an amino group or a mercapto group, or an amide thereof with a monofunctional or polyfunctional isocyanate or a epoxy, and a dehydrated condensation product of the above unsaturated carboxylate or amide with a monofunctional or polyfunctional carboxylic acid are also preferably used. Further, an addition product of an unsaturated carboxylate having an electrophilic substituent such as an isocyanate group or an epoxy group, or an amide thereof with a monofunctional or polyfunctional alcohol, amine or thiol, and a substitution reaction product of an unsaturated carboxylate having a releasing group such as a halogen atom or a tosyloxy group, or an amide thereof with a monofunctional or polyfunctional alcohol, amine or thiol are preferably used. Moreover, a group of compounds obtained by replacing the unsaturated carboxylic acid in the foregoing examples by an unsaturated sulfonic acid, styrene or vinyl ether may also used.

Specific examples of the monomer of an ester of an aliphatic polyhydric alcohol compound and an unsaturated carboxylic acid include an acrylate, e.g., ethylene glycol diacrylate, triethylene glycol diacrylate, 1,3-butanediol diacrylate, tetrametylene glycol diacrylate, propylene glycol diacrylate, neopentyl glycol diacrylate, tirmethylolpropane triacrylate, trimethylolpropane tri(acryloyloxypropyl) ether, trimethylolpropane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol tetraacrylate, sorbitol pentaacrylate, sorbitol hexaacrylate, tri(acryloyloxyethyl) isocyanurate or a polyester acrylate oligomer; an methacrylate, e.g., tetramethylene glycol dimethacrylate, triethylene glycol dimethacrylate, neopentyl glycol dimethacrylate, trimethylolpropane trimethacrylate, trimethylolethane trimethacrylate, ethyelene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis(p-(3-methacryloxy-2-hydroxypropoxy)phenyl)-dimethylmethane or bis(p-(methacryloxyethoxy)phenyl)dimethylmethane; an itaconate, e.g., ethylene glycol diitaconate, propylene glycol diitaconate, 1,3-butanediol diitaconate, 1,4-butanediol diitaconate, tetramethylene glycol diitaconate, pentaerythritol diitaconate or sorbitol tetraitaconate; a crotonate, e.g., ethylene glycol dicrotonate, tetramethylene glycol dicrotonate, pentaerythritol dicrotonate or sorbitol tetracrotonate; an isocrotonate, e.g., ethylene glycol diisocrotonate, pentaerythritol diisocrotonate or sorbitol tetraisocrotonate; and a maleate, e.g., ethylene glycol dimaleate, triethylene glycol dimaleate, pentaerythritol dimaleate or sorbitol tetramaleate.

Examples of other esters that can be preferably used include an aliphatic alcohol ester disclosed in JP-B-46-27926, JP-B-51-47334 and JP-A-57-196231, an ester having an aromatic skeleton disclosed in JP-A-59-5240, JP-A-59-5241 and JP-A-2-226149, and an ester containing an amino group disclosed in JP-A-1-165613.

The ester monomers can be used as a mixture.

Specific examples of a monomer of amide of an aliphatic polyvalent amine compound and an unsaturated carboxylic acid include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide.

Examples of other preferred amide monomers include a monomer having a cyclohexylene structure disclosed in JP-B-54-21726.

A urethane addition polymerizable compound produced by using an addition reaction of an isocyanate and a hydroxyl group is also preferred, and specific examples thereof include a vinylurethane compound containing two or more polymerizable vinyl groups in one molecule formed by adding a vinyl monomer containing a hydroxyl group represented by the following formula (5) to a polyisocyanate compound having two or more isocyanate groups in one molecule, disclosed in JP-B-48-41708.

$$CH_2{=}C(R^4)COOCH_2CH\,(R^5)OH \qquad (5)$$

wherein $R^4$ and $R^5$ each represents H or $CH_3$.

A urethane acrylate disclosed in JP-A-51-37193, JP-B-2-32293 and JP-B-2-16765, and a urethane compound having an ethylene oxide skeleton disclosed in JP-B-58-49860, JP-B-56-17654, JP-B-62-39471 and JP-B-62-39418 are also preferred.

By using an addition polymerizable compound having an amino structure or a sulfide structure in the molecule disclosed in JP-A-63-277653, JP-A-63-260909 and JP-A-1-105238, a photopolymerizable composition excellent in sensitivity can be obtained.

Other examples thereof include a polyester acrylate disclosed in JP-A-48-64183, JP-B-49-43191 and JP-B-52-30490 and a polyfunctional acrylate or methacrylate, for example, an epoxy acrylate formed by reacting an epoxy resin with (meth)acrylic acid. A specific unsaturated compound disclosed in JP-B-46-43946, JP-B-1-40337 and JP-B-1-40336, and a vinylsulfonic acid compound disclosed in JP-A-2-25493 are also exemplified. In some cases, a structure containing a perfluoroalkyl group disclosed in JP-A-61-22048 is preferably used. Furthermore, photocurable monomers and oligomers described in *Nippon Secchaku Kyoukai-Shi* (Journal of the Adhesion Society of Japan), vol. 20, No. 7, pp. 300 to 308 (1984) can also be used.

With respect to the addition polymerizable compound, detail of usage, for example, the structure thereof, single use or combination use or the addition amount, can be appropriately set depending on the performance design of the desired negative-working photosensitive lithographic printing plate. For example, they can be selected taking the following factors into consideration. A structure having a large number of unsaturated groups in one molecule is preferred in sensitivity, and in many cases, bifunctional or higher is preferred. In order to increase the strength of the image area, i.e., the hardened portion, trifunctional or higher is preferred. It is also effective to adjust both the sensitivity and the strength by using those having different functionality and different polymerizable groups (for example, an acrylate, a methacrylate, a styrene compound and a vinyl ether compound) in combination. A compound having a large molecular weight and a compound having higher hydrophobicity are excellent in sensitivity and film strength, but is not preferred in some cases in development speed and deposition in a developing solution. The selection and the usage of the addition polymerizable compound are important factors for the compatibility and the dispersibility with the other components in the photosensitive layer (for example, a binder polymer, an initiator and a coloring agent), and for example, the compatibility can be improved by using a low purity compound or by using two or more compounds in combination.

A particular structure can be selected in order to improve adhesion to the base material and an overcoat layer described later. A large proportion of the addition polymerizable compound in the photosensitive layer is advantageous for sensitivity, but when the proportion is too large, such a problem occur that unfavorable phase separation arises, and also a problem in production process due to tackiness of the photosensitive layer (for example, transfer of the components of the photosensitive layer and production failure due to adhesion) and a problem of deposition in a developing solution may occur. Under these circumstances, the addition polymerizable compound is preferably used in an amount of from 5 to 80% by weight, and more preferably in an amount of from 25 to 75% by weight, based on the non-volatile components in the photosensitive layer. They may be used solely or in combination of two or more thereof. With respect to the usage of the addition polymerizable compound, suitable structure, blend and addition amount can be appropriately selected taking the extent of polymerization inhibition due to oxygen, the resolution, the fogging property, the change in refractive index and the surface adhesiveness into consideration, and in some cases, such a layer structure and a coating method as undercoating or overcoating can be carried out.

Other Components

In the photopolymerizable or heat polymerizable negative-working photosensitive layer, which is preferred as the photosensitive layer of the photosensitive lithographic printing plate according to the invention, other components suitable for the use and the production thereof than the foregoing basic components may be appropriately added. Examples of the preferred additives will be described below.

<Polymer Binder>

A binder polymer is preferably used in the photosensitive layer of the photosensitive lithographic printing plate according to the invention. The binder preferably contains a linear organic polymer. The linear organic polymer herein is not particularly limited. Preferably, a linear organic polymer that is soluble or swellable with water or a weak alkali aqueous solution capable of being developed with water or a weak alkali aqueous solution is selected. The linear organic polymer is selected not only for the purpose of a film forming member in the composition but also for the purpose of developing with water, a weak alkali aqueous solution or an organic solvent developing solution. For example, the use of a water-soluble organic polymer provides capability of development with water. Examples of the linear organic polymer include an addition polymer having a carboxylic acid group on a side chain, such as those disclosed in JP-A-59-44651, JP-B-54-34327, JP-B-58-12577, JP-B-54-25957, JP-A-54-92723, JP-A-59-53836 and JP-A-59-71048, specifically, a methacrylic acid copolymer, an acrylic acid copolymer, an itaconic acid copolymer, a crotonic acid copolymer, a maleic acid copolymer and a partially esterified maleic acid copolymer. An acidic cellulose derivative having a carboxylic group on a side chain is also exemplified. Additionally, a polymer obtained by adding a cyclic anhydride to an addition polymer having a hydroxyl group is also useful.

Among these, a copolymer of benzyl (meth)acrylate and (meth)acrylic acid and if desired, another addition polymerizable vinyl monomer and a copolymer of allyl (meth) acrylate and (meth)acrylic acid and if desired, another addition polymerizable monomer are preferred owing to good balance among the film strength, the sensitivity and the development property.

A urethane binder polymer having an acid group disclosed in JP-B-7-120040, JP-B-7-120041, JP-B-7-120042, JP-B-8-12424, JP-A-63-287944, JP-A-63-287947, JP-A-1-271741 and JP-A-10-116232 is excellent in strength, and thus it is advantageous in printing durability and suitability for low exposure.

A binder having an amido group disclosed in JP-A-11-171907 is preferred owing to excellent developing property and film strength.

Furthermore, polyvinyl pyrrolidone and polyethyleneoxide are useful as the water-soluble linear organic polymer. In order to improve the strength of the hardened film, alcohol-soluble nylon and a polyether of 2,2-bis (4-hydroxyphenyl) propane and epichlorohydrin are useful. The linear organic polymer may be mixed with the composition of the photosensitive layer in an appropriate amount. However, when it exceeds 90% by weight, no preferred result can be obtained from the standpoint of the strength of the image thus produced. The amount thereof is preferably from 30 to 85% by weight. The weight ratio of the compound having a photopolymerizable ethylenically unsaturated double bond and the linear organic polymer is preferably in a range of from 1/9 to 7/3.

In a preferred embodiment, a binder polymer that is substantially not soluble in water but is soluble in an alkali is used. According to the selection of such a binder polymer, an organic solvent, which is harmful to environment, is not necessary to use, or the amount thereof can be suppressed to a considerably low level. In such usage, the acid value (an acid content per 1 g of the polymer expressed in terms of chemical equivalent) and the molecular weight of the binder polymer are appropriately selected in view of the image strength and the developing property. It is preferred that the acid value is from 0.4 to 3.0 meq/g, and the molecular weight is from 3,000 to 500,000, and it is more preferred that the acid value is from 0.6 to 2.0 meq/g, and the molecular weight is from 10,000 to 300,000.

<Heat Polymerization Inhibitor>

In the photopolymerizable or heat polymerizable negative-working photosensitive layer, which is particularly preferred as the photosensitive layer of the photosensitive lithographic printing plate according to the invention, a small amount of a heat polymerization inhibitor is preferably added to prevent unnecessary heat polymerization of the compound having a polymerizable ethylenically unsaturated double bond during the production and storage of negative-working photosensitive composition. Suitable examples of the heat polymerization inhibitor include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol), N-nitrosophenylhydroxylamine cerous salt and N-nitrosophenylhydroxylamine aluminum salt. The addition amount of the heat polymerization inhibitor is preferably approximately from 0.01 to 5% by weight based on the weight of the nonvolatile components in the total photosensitive layer composition. Furthermore, if desired, in order to prevent polymerization inhibition due to oxygen, a higher fatty acid derivative, for example, behenic acid or behenic amide, may be added or may be unevenly distributed on the surface of the photosensitive layer during the process of drying after coating. The addition amount of the higher fatty acid derivative is preferably approximately from 0.5 to 10% by weight based on the non-volatile components in the total composition.

<Coloring Agent>

In the photosensitive layer of the photosensitive lithographic printing plate according to the invention, a dye or a pigment may be added to color the photosensitive layer. By the addition of coloring agent, a so-called plate checking property, i.e., the visibility after plate-making and suitability to measurement of image density, can be improved. Because a dye ordinarily causes decrease of the sensitivity of the photopolymerizable photosensitive layer, a pigment is preferably used as the coloring agent. Specific examples of the pigment include a phthalocyanine pigment, an azo pigment, carbon black and titanium oxide, and specific examples of the dye include Ethyl Violet, Crystal Violet, an azo dye, an anthraquinone dye and a cyanine dye. The addition amount of the dye and the pigment is preferably approximately from 0.5 to 5% by weight based on the non-volatile component in the total composition.

<Other Additives>

Furthermore, known additives, for example, an inorganic filler for improving the property of the hardened film, as well as a plasticizer and an oil-sensitizing agent for improving the ink-receptive property of the surface of photosensitive layer, may be added.

Examples of the plasticizer include dioctyl phthalate, didodecyl phthalate, triethylene glycol dicaprylate, dimethylglycol phthalate, tricresyl phosphate, dioctyl adipate, dibutyl sebacate and triacetylglycerin, and it may be ordinarily added in an amount of 10% by weight or less based on the total weight of the polymer binder and the addition polymerizable compound.

An UV initiator and a heat crosslinking agent may also be added to enhance the effect of heating and exposure after development, whereby the film strength (printing durability) is improved.

In the photosensitive layer according to the photosensitive lithographic printing plate of the invention, a photopolymerization initiator of the same kind as or a different kind from that bonded to the support may be contained for various purposes, for example, complete polymerization in the direction of the thickness of the photosensitive layer.

The photosensitive composition for the photosensitive layer is dissolved in various kinds of organic solvents, and then coated on the hydrophilic graft polymer of the base material to prepare a photosensitive layer. Examples of the solvent used include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl acetate, ethylene glycol monobutyl ether acetate, 3-methyoxypropanol, methoxyethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate and ethyl lactate. These solvents may be used solely or as a mixture of two or more thereof. The concentration of the solid content in the coating solution is suitably from 2 to 50% by weight.

The coating amount of the photosensitive layer is preferably determined depending on purpose because it may mainly influence on the sensitivity and the developing property of the photosensitive layer, the strength of the exposed film and the printing durability. When the coating amount is too small, the printing durability becomes insufficient. When it is too large, it is not preferred since the sensitivity decreases to necessitate prolonged exposure time, and furthermore, a longer period of time is required for the developing treatment. As for the scanning exposure photosensitive lithographic printing plate, which is a preferred embodiment according to the invention, the coating amount is preferably approximately from 0.1 to 10 $g/m^2$, and more preferably from 0.5 to 5 $g/m^2$, after drying.

Protective Layer

In the photosensitive lithographic printing plate according to the invention, it is preferred to provide a protective layer on the photosensitive layer because exposure is ordinarily carried out in the air. The protective layer prevents penetration, into the photosensitive layer, of oxygen and a low molecular weight compound such as a basic substance present in the air, which inhibit the image forming reaction occurring upon exposure in the photosensitive layer, whereby exposure in the air can be performed. Therefore, characteristics demanded in the protective layer is low permeability of the low molecular weight compound and oxygen, and also it is preferred that the protective layer substantially does not inhibit transmission of light used for exposure, is excellent in adhesion to the photosensitive layer, and can be easily removed on the developing step after exposure. Studies on the protective layer have been made hitherto, and are described in detail in U.S. Pat. No. 3,458,311 and JP-A-55-49729.

As a material that can be used in the protective layer, for example, a water-soluble polymer compound having relatively good crystallinity is preferably used, and specific examples thereof include a water-soluble polymer, such as polyvinyl alcohol, polyvinyl pyrrolidone, acidic cellulose, gelatin, gum arabic and polyacrylic acid. Among these, the use of polyvinyl alcohol as a main component provides the best results in the basic characteristics, i.e., the oxygen blocking property and the removability upon development. The polyvinyl alcohol used in the protective layer may be partially substituted with an ester, an ether or an acetal as far as such an amount of non-substituted vinyl alcohol units that provides the necessary oxygen blocking property and water solubility. Similarly, a part thereof may contain other copolymerization components. Specific examples of the polyvinyl alcohol include those having been hydrolyzed in a ratio of from 71 to 100% and having a molecular weight in a range of from 300 to 2,400.

Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8, all produced by Kraray Co., Ltd.

The components of the protective layer (selection of PVA and use of additives) and the coating amount thereof are selected under consideration of the oxygen blocking property and the removability upon development, as well as the fogging property, the adhesion property and the scratch resistance. In general, when the hydrolysis ratio of the PVA used is higher (i.e., when the content of the unsubstituted vinyl alcohol units in the protective layer is higher), and when the film thickness is larger, the oxygen blocking property is increased, which is advantageous from the standpoint of sensitivity. However, when the oxygen blocking property is extremely increased, such problems arise that a undesirable polymerization reaction occurs during the production and storage before use, and unnecessary fogging and thickening of lines occur upon imagewise exposure. The adhesion property to the image area and the scratch resistance are also extremely important upon handling the plate. Specifically, when a hydrophilic layer comprising a water-soluble polymer is coated on a lipophilic photosensitive layer, release of the layer is liable to occur due to shortage in adhesion force, and the released part causes such a problem as hardening failure of the film due to polymerization inhibition of oxygen. In order to solve the problem, various proposals have been made to improve the adhesion between the two layers. For example, U.S. Pat. No. 292,501 and U.S. Pat. No. 44,563 disclose methods wherein a hydrophilic polymer mainly composed of polyvinyl alcohol is mixed with from 20 to 60% by weight of an acrylic emulsion or a water-insoluble vinylpyrrolidone-vinyl acetate copolymer, and then the mixture is coated on a photosensitive layer, thereby obtaining sufficient adhesion. These known techniques may be applied to the protective layer in the photosensitive lithographic printing plate according to the invention. The coating method of the protective layer is described in detail in U.S. Pat. No. 3,458,311 and JP-A-55-49729.

In the plate-making process for making a lithographic printing plate from the photosensitive lithographic printing plate according the invention, the whole surface thereof may be heated before exposure, during exposure or from exposure to development, if desired. By carrying out the heating, the image forming reaction in the photosensitive layer is accelerated to obtain such advantages as improvement of the sensitivity and the printing durability, and stability of the sensitivity. Furthermore, in order to improve the image strength and the printing durability, it is effective to carry out heating or exposure to light on the whole surface of the image after development. In general, the heating before the development is preferably carried out under moderate conditions of 150° C. or less. When the temperature is too high, such a problem occurs that the non-image part is also fogged. The heating after the development is carried out under severe conditions, which is ordinarily in a range of from 200 to 500° C. When the temperature is too low, a sufficient image strengthening effect cannot be obtained, and when it is too high, such problems occur as deterioration of the support and heat decomposition of the image area.

Exposing Method

As the exposing method of the photosensitive lithographic printing plate according to the invention, known methods can be employed without any limitation. The wavelength of the light source is preferably from 300 to 1,200 nm, and specifically, alight source of various kinds of laser is preferred. The exposure mechanism may be an inner drum system, an outer drum system or a flat-bed system. When components having high water solubility are used in the photosensitive layer of the photosensitive lithographic printing plate, since the components can be dissolved in neutral water or weak alkaline water, such a photosensitive lithographic printing plate is mounted on a printing machine and subjected to a process of exposure and development on machine.

Examples of other exposure light sources for the photosensitive lithographic printing plate according to the invention include a super high pressure, high pressure, medium pressure or low pressure mercury lamp, a chemical lamp, a carbon arc lamp, a xenon lamp, a metal halide lamp, various kinds of laser lamps of visible rays and ultraviolet rays, a fluorescent lamp, a tungsten lamp and sunlight.

Developing Method

The photosensitive lithographic printing plate according to the invention, after exposure, is subjected to a developing treatment, if desired. In the case where the hydrophilicity of the photosensitive layer component is high, it may be subjected to exposure and development on machine without passing through a developing machine.

As a developing solution used in the developing treatment, an alkali aqueous solution of pH of 14 or less is preferred, and more preferably, an alkali aqueous solution of pH of from 8 to 12 containing an anionic surface active agent is used. Examples of the alkali agent include an inorganic alkali agent, for example, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium bicarbonate, potassium bicarbonate, ammonium bicarbonate, sodium borate, potassium borate, ammonium borate, sodium hydroxide, ammonium hydroxide, potassium hydroxide and lithium hydroxide; and an organic alkali agent, for example, monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine.

The alkali agents may be used solely or in combination of two or more thereof.

In the developing treatment of the photosensitive lithographic printing plate according to the invention, an anionic surface active agent is added in the developing solution in an amount of from 1 to 20% by weight, and preferably in an amount of from 3 to 10% by weight. When the amount is too small, the development property is deteriorated, and when it is too large, an adverse effect, for example, deterioration of the strength of the image such as abrasion resistance of the image arises.

Examples of the anionic surface active agent include a sodium salt of lauryl alcohol sulfate, an ammonium salt of lauryl alcohol sulfate, a sodium salt of octyl alcohol sulfate, a sodium salt of isopropylnaphthalene sulfonic acid, a sodium salt of isobutylnaphthalene sulfonic acid, a sodium salt of polyoxyethylene glycol mononaphthyl ether sulfate, an alkylaryl sulfonate, e.g., sodium dodecylbenzene sulfonate or sodium m-nitrobenzene sulfonate, a sulfate of a higher alcohol having from 8 to 22 carbon atoms, e.g., secondary sodium alkyl sulfate, a salt of an aliphatic alcohol phosphate, e.g., sodium salt of cetyl alcohol phosphate, a sulfonic acid salt of an alkylamide, such as $C_{17}H_{33}CON(CH_3)CH_2CH_2SO_3Na$, and a sulfonic acid salt of a dibasic aliphatic ester, such as sodium dioctylsulfosuccinate or sodium dihexylsulfosuccinate.

An organic solvent miscible with water, for example, benzyl alcohol, may be added to the developing solution, if desired. As the organic solvent, that having solubility in water of about 10% by weight or less is preferred, and that having solubility in water of 5% by weight or less is more preferred. Examples of the solvent include 1-phenylethanol, 2-phenylethanol, 3-phenylpropanol, 1,4-phenylbutanol, 2,2-phenylbutanol, 1,2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 4-methylcyclohexanol and 3-methylcyclohexanol. The content of the organic solvent is preferably from 1 to 5% by weight based on the total weight of the developing solution. The amount of the solvent has a close relationship to the amount of the surface active agent, and as the amount of the organic solvent is increased, it is preferred that the amount of the anionic surface active agent is increased. This is because when a large amount of the organic solvent is used in such a state that the amount of the anionic surface active agent is small, the organic solvent is not dissolved, whereby maintenance of good development property cannot be expected.

Furthermore, an additive, for example, a defoaming agent or a softening agent for hard water may be added to the developing solution, if desired. Examples of the softening agent for hard water include a polyphosphate, e.g., $Na_2P_2O_7$, $Na_5P_3O_3$, $Na_3P_3O_9$, $Na_2O_4P(NaO_3P)$ $PO_3Na_2$ or calgon (sodium polymetaphosphate); an aminopolycarboxylic acid, e.g., ethylenediaminetetraacetic acid or potassium salt or sodium salt thereof, diethylenetriaminepentaacetic acid or potassium salt or sodium salt thereof, triethylenetetraminehexaacetic acid or potassium salt or sodium salt thereof, hydroxyethylethylenediaminetriacetic acid or potassium salt or sodium salt thereof, nitrilotriacetic acid or potassium salt or sodium salt thereof, 1,2-diaminocyclohexanetetraacetic acid or potassium salt or sodium salt thereof, or 1,3-diamino-2-propanoltetraacetic acid or potassium salt or sodium salt thereof; and an organic phosphonic acid, e.g., 2-phosphonobutane-1,2,4-tricarboxylic acid or potassium salt or sodium salt thereof, 2-phosphonobutane-2,3,4-tricarboxylic acid or potassium salt or sodium salt thereof, 1-phosphonoethane-1, 2, 2-tricarboxylic acid or potassium salt or sodium salt thereof, 1-hydroxyethane-1,1-diphosphonic acid or potassium salt or sodium salt thereof and aminotri (methylenephosphonic acid) or potassium salt or sodium salt thereof. The optimum amount of the softening agent for hard water varies depending on the hardness of hard water used and the amount thereof, and in general, it is preferably from 0.01 to 5% by weight, and more preferably from 0.01 to 0.5% by weight, in the developing solution.

The photosensitive lithographic printing plate thus-developed may be subjected to a post treatment with washing water, a rinsing solution containing a surface active agent or a desensitizing solution containing gum arabic or a starch derivative, as described in JP-A-54-8002, JP-A-55-115045 and JP-A-59-58431. In the post treatment for the photosensitive lithographic printing plate according to the invention, these treatments may be used in combination.

The lithographic printing plate thus-obtained is mounted on an offset printing machine for printing a large number of printed matter.

The invention will be described in more detail with reference to the following examples, but the invention should not be construed as being limited thereto.

EXAMPLE 1

Preparation of Graft Hydrophilic Support

On a PET film having a thickness of 0.188 mm (M4100, produced by Toyobo Co., Ltd.), the photopolymerizable composition shown below was coated by using a rod bar #17 and dried at 80° C. for 2 minutes. The coated film was then irradiated by using a 400 W high pressure mercury lamp (UVL-400P, produced by Riko Kagaku Sangyo Co., Ltd.) for 10 minutes. The film was then immersed in a 10% aqueous solution of sodium styrene sulfonate and irradiated by using a 400 W high pressure mercury lamp in argon atmosphere for 30 minutes. The film after the light irradiation was thoroughly washed with ion exchanged water to obtain a film having a hydrophilic surface, on which sodium styrene sulfonate was graft-polymerized.

<Photopolymerizable Composition>

| | |
|---|---|
| Allyl methacrylate/methacrylic acid copolymer (molar ratio: 80/20, molecular weight: 100,000) | 4 g |
| Ethylene oxide-modified bisphenol A diacrylate (M210, produced by Toagosei Co., Ltd.) | 4 g |
| 1-Hydroxycyclohexyl phenyl ketone | 1.6 g |
| 1-Methoxy-2-propanol | 16 g |

Adsorption of IR Dye

The graft hydrophilic support was immersed in water for 30 seconds, and then immediately immersed in a 0.2% by weight methanol solution of an IR dye (IR-A) shown below for 5 minutes. The support was then washed with methanol to obtain a base material having the IR dye ionically bonded to the grafted polymer thereon.

IR-A

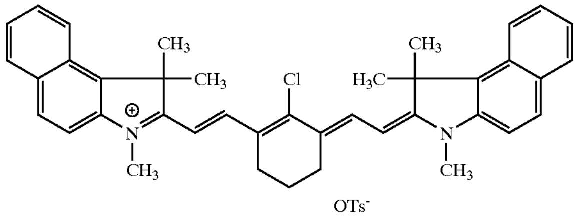

Preparation of Lithographic Printing Plate

A heat sensitive layer composition comprising 0.6 g of sulfonate polymer (1P) shown below and 7 g of acetonitrile was coated on the dye adsorbed graft hydrophilic layer using a rod bar #14, followed by drying at 80° C. for 1 minute, to obtain the desired lithographic printing plate. The layer thickness after drying was 1.0 μm.

1P

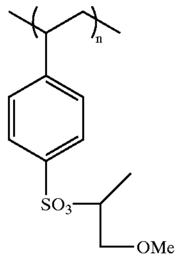

Formation of Image and Evaluation of Printing Property

The resulting lithographic printing plate was exposed using Pearl Setter (produced by Presstek, Inc., IR laser of 830 nm, output: 0.6 W, main scanning speed: 2 m/sec) and then mounted on a printing machine without subjecting any other treatment, followed by carrying out printing. The printing machine used was Heidelberg SOR-M, dampening water was a 1/100 diluted solution of EU-3, and printing ink was GEOS-G Black (produced by Dainippon Ink and Chemicals, Inc.). Clear printed matter without stain was obtained even after printing 1,000 sheets.

COMPARATIVE EXAMPLE 1

A printing plate was produced and evaluated in the same manner as in Example 1 except that the IR dye was not chemically bonded to the hydrophilic layer, but 0.15 g of the same dye was added to the heat sensitive layer composition and coated. As a result, no image could be obtained. In order to obtain an image, it was necessary that the output of the laser be increased to 1.2 W.

EXAMPLE 2 AND COMPARATIVE EXAMPLE 2

Printing plates were produced and evaluated in the same manners as in Example 1 and Comparative Example 1 except for using negative-working polymer (P-9) having the structure shown below in place of the sulfonate polymer (1P), respectively.

P-9

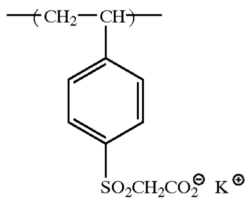

As a result, the sensitivity (i.e., an output of the exposure device necessary for obtaining a printed image) was 0.8 W in Example 2, whereas it was 1.4 W in Comparative Example 2.

EXAMPLE 3

Preparation of Graft Hydrophilic Support

A biaxially stretched polyethylene terephthalate film having a thickness of 188 μm (A4100, produced by Toyobo Co., Ltd.) was subjected to an oxygen glow treatment by using a flat plate magnetron sputtering apparatus (CFS-10-EP70, produced by Shibaura Eletec Corp.) under the following conditions.

| <Oxygen Glow Treatment Conditions> | |
|---|---|
| Initial vacuum pressure: | $1.2 \times 10^{-3}$ Pa |
| Oxygen pressure: | 0.9 Pa |
| RF glow output: | 1.5 kW |
| Treatment time: | 60 sec |

The film subjected to the glow treatment was immersed in a 10% by weight aqueous solution of sodium styrene sulfonate, into which nitrogen was bubbled, at 70° C. for 7 hours. The film was washed with water for 8 hours to obtain a support having a graft chain of sodium styrene sulfonate on the surface thereof.

Adsorption of IR Dye

The IR dye (IR-A) was ionically bonded to the grafted polymer on the support in the same manner as in Example 1 to prepare a base material according to the invention.

Preparation of Lithographic Printing Plate

A coating solution for image forming layer shown below was coated on the base material in a dry coating amount of 1.0 g/m$^2$ and dried using Perfect Oven PH200 (produced by Tabai Co.) adjusted wind control to 7 at 140° C. for 50 seconds to form an image forming layer, thereby preparing a positive-working lithographic printing plate.

| <Coating Solution for Image Forming Layer> | |
|---|---|
| N-(4-Aminosulfonylphenyl)methacrylamide/acrylonitrile/methyl methacrylate copolymer (molar ratio: 35/35/30, weight average molecular weight: 50,000) | 1.896 g |

-continued

| <Coating Solution for Image Forming Layer> | |
|---|---|
| Novolak resin (Sumilite Resin PR 54020, produced by Sumitomo Durez Co., Ltd.) | 0.332 g |
| Cyanine Dye B shown below | 0.155 g |
| 4,4'-Bishydroxyphenylsulfone | 0.063 g |
| Tetrahydrophthalic anhydride | 0.190 g |
| p-Toluenesulfonic acid | 0.008 g |
| Dye (prepared by replacing the counter ion of Ethyl Violet by 6-hydroxynaphthalanesulfonic acid) | 0.05 g |
| Fluorine surface active agent (Megafac F-176, produced by Dainippon Ink and Chemicals, Inc.) | 0.145 g |
| Fluorine surface active agent (Megafac MCF-312, produced by Dainippon Ink & Chemicals, Inc. (30%)) | 0.120 g |
| Methyl ethyl ketone | 26.6 g |
| 1-Methoxy-2-propanol | 13.6 g |
| γ-Butyrolactone | 13.8 g |

Cyanine Dye B

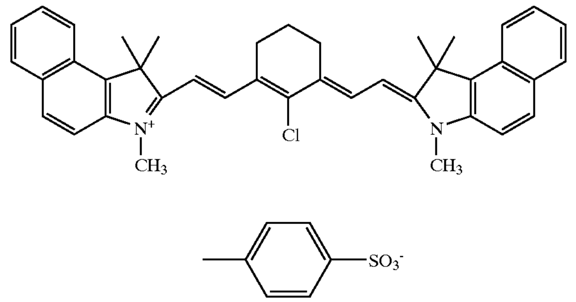

Formation of Image and Evaluation of Printing Property

The resulting lithographic printing plate was subjected to writing a test pattern using Trendsetter (produced by Creo Inc.) at beam power of 9 W and a drum rotation speed of 150 rpm. Then, the lithographic printing plate was developed at 30° C. for 12 seconds using a processing machine (PS Processor 900H, produced by Fuji Photo Film Co., Ltd.) supplied with a developing solution (a 1/8 diluted solution of DT-1, produced by Fuji Photo Film Co., Ltd.) and a 1/1 diluted solution of Finisher FP2W (produced by Fuji Photo Film Co., Ltd.).

The printing plate obtained was mounted on a printing machine (Ryobi 3200, produced by Ryobi Ltd.) and printed using as dampening water, IF201 (2.5%) and IF202 (0.75%) (produced by Fuji Photo Film Co., Ltd.), and as printing ink, GEOS-G Black (produced by Dainippon Ink and Chemicals, Inc.). Clear printed matter without stain was obtained even after printing 9,000 sheets.

EXAMPLE 4

Preparation of Graft Hydrophilic Support

On a PET film having a thickness of 0.188 mm (M4100, produced by Toyobo Co., Ltd.), the photopolymerizable composition shown below was coated as an undercoating by using a rod bar #17 and dried at 80° C. for 2 minutes. The coated film was then irradiated by using a 400 W high pressure mercury lamp (UVL-400P, produced by Riko Kagaku Sangyo Co., Ltd.) for 10 minutes. The film was then immersed in a 10% aqueous solution of acrylic acid and irradiated by using a 400 W high pressure mercury lamp under argon atmosphere for 30 minutes. The film after the light irradiation was thoroughly washed with ion exchanged water to obtain a film having a hydrophilic surface, on which acrylic acid was graft-polymerized.

| <Photopolymerizable Composition> | |
|---|---|
| Allyl methacrylate/methacrylic acid copolymer (molar ratio: 80/20, molecular weight: 100,000) | 4 g |
| Ethylene oxide-modified bisphenol A diacrylate (M210, produced by Toagosei Co., Ltd.) | 4 g |
| 1-Hydroxycyclohexyl phenyl ketone | 1.6 g |
| 1-Methoxy-2-propanol | 16 g |

Adsorption of Photopolymerization Initiator or Photosensitizer

The graft hydrophilic support was immersed in water for 30 seconds, and then immediately immersed in each of methanol solutions containing photopolymerization initiators and photosensitizers having the structures shown below for 5 minutes. Each support was then washed with methanol to obtain Base Materials A, B, C and D having the photopolymerization initiator or photosensitizer chemically bonded to the grafted polymer thereon.

Base Material A: Quatacure QTX 1.0% by weight

Base Material B: BR-A 1.0% by weight

Base Material C: IR-A 1.0% by weight

Base Material D: IR-A 1.0% by weight and IR-B 1.0% by weight

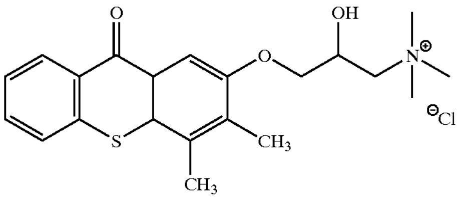

Quatercure QTX

BR-A

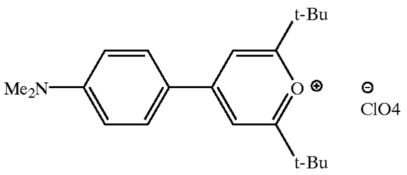

IR-B

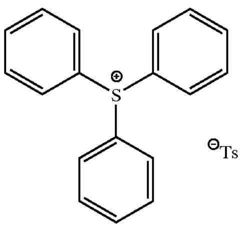

IR-C

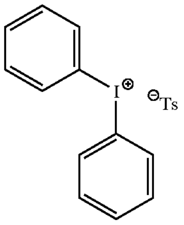

-continued

TR

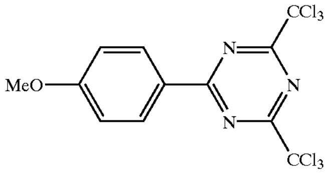

IR-A

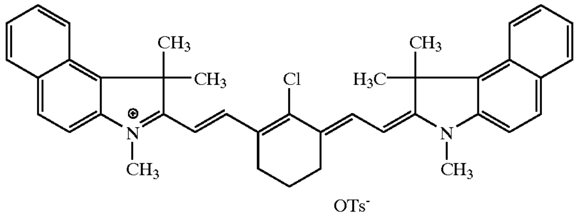

Coating of Polymerizable Composition

On Base Materials A to C, polymerization compositions A1, B1 and C1 shown below were coated in a dry coating amount of 2.0 g, followed by drying at 100° C. for 1 minute, to produce negative-working photosensitive lithographic printing plates A2, B2 and C2, respectively.

As comparative printing plates, polymerization compositions E1 and F1 shown below were coated on a graft hydrophilic support having no photopolymerization initiator bonded thereon to produce photosensitive lithographic printing plates E2 and F2.

Polymerization Composition A1:

Composition containing 1 to 6 shown below

Polymerization Composition B1:

Composition containing 1 to 6 shown below and 0.2 g of TR added thereto

Polymerization Composition C1:

Composition containing 1 to 6 shown below and 0.2 g of IR-C added thereto

Polymerization Composition E1:

Composition containing 1 to 6 shown below and 0.4 g of 2,4-diethyl-9H-thioxanthen-9-one added thereto Polymerization Composition F1:

Composition containing 1 to 6 shown below and 0.2 g of TR and 0.2 g of BR-A added thereto

| | |
|---|---|
| 1. Addition polymerizable compound (pentaerythritol tetraacrylate, NK Ester A-TMMT, produced by Shin-Nakamura Chemical Co., Ltd.) | 1.5 g |
| 2. Binder polymer (allyl methacrylate/methacrylic acid copolymer, copolymerization ratio: 80/20 by mole, acid value measured by NaOH titration: 1.70 meq/g, weight average molecular weight measured by GPC: 48,000) | 2.0 g |
| 3. Fluorine nonionic surface active agent (Megafac F-177, produced by Dainippon Ink and Chemicals, Inc.) | 0.03 g |
| 4. Heat polymerization inhibitor (N-nitrosophenylhydroxylamine aluminum salt) | 0.01 g |
| 5. Methyl ethyl ketone | 20.0 g |
| 6. Propylene glycol monomethyl ether | 20.0 g |

Application of Protective Layer

On the photosensitive layer, a 3% by weight aqueous solution of polyvinyl alcohol (saponification degree: 98% by mole, polymerization degree: 550) was coated to a dry coating amount of 0.5 g/$m^2$, followed by drying at 100° C. for 2 minutes.

The optical density at 330 nm of the printing plate E2 was 1.2, and that of the printing plate A2 was 1.1.

The optical density at 500 nm of the printing plate F2 was 1.2, and that of the printing plate B2 was 1.1.

Exposure of Negative-Working Photosensitive Lithographic Printing Plate

<Printing Plates A2 and E2>

Exposure was carried out for 1 minute using a metal halide lamp of 3 kW with a distance of 1 m through a step wedge (density difference of each step: 0.15) produced by Fuji Photo Film Co., Ltd.

<Printing Plates B2 and F2>

Exposure of a solid image and exposure of a dot image of 2,540 dpi, 175 lines per inch and from 1 to 99% with a step of 1% were carried out by using a laser exposing device FD-YAG (532 nm) (Plate Setter Gutenberg, produced by Heidelberg, Inc.), which was adjusted in exposure power to make an exposure energy density on the plate surface of 200 $\mu$J/cm.

<Printing Plate C2>

Exposure was carried out by using Trendsetter 3244VFS, produced by Creo, Inc. having a 40 W water-cooled infrared semiconductor laser installed therein under the conditions of an output of 9 W, a rotation number of the outer drum of 210 rpm, an energy on the plate surface of 100 mJ/cm$^2$, and a resolution of 2,400 dpi.

Development and Plate-Making

The developing solution D-1 shown below and Finisher FP-2W produced by Fuji Photo Film Co., Ltd. were charged in an automatic developing machine (FLP-813, produced by Fuji Photo Film Co., Ltd.), and the exposed plates were developed and subjected to plate-making under the conditions of a temperature of the developing solution of 30° C. and a developing time of 18 seconds to obtain lithographic printing plates.

<D-1>

| Aqueous solution of pH 10 having the following composition: | |
|---|---|
| Monoethanolamine | 0.1 part by weight |
| Triethanolamine | 1.5 parts by weight |
| Sodium dibutylnaphthalene sulfonate | 4.0 parts by weight |
| Ethylene glycol mononaphthyl ether monosulfate sodium salt | 2.5 parts by weight |
| Tetrasodium Ethylenediamine-tetraacetate | 0.2 parts by weight |
| Water | 91.7 parts by weight |

Sensitivity Test

The number of steps remained as the image was determined. The larger the value is, the higher the sensitivity is.

Printing Durability Test

Printing was conducted using as a printing machine, R201 produced by Roland Corp. and as printing ink, GEOS G(N) produced by Dainippon Ink and Chemicals, Inc. The printing durability of the image part was evaluated by observing the solid image part of the printed matter and the number of sheets, at which the solid image started to be blurred, was determined. The larger the number is, the better the printing durability is. The results are shown in Table 1 below.

TABLE 1

| | Sensitivity (number of steps) | Printing Durability (number of sheets) |
|---|---|---|
| Printing Plate A2 | 8 | 20,000 |
| Printing Plate B2 | 8 | 25,000 |
| Printing Plate C2 | 8 | 18,000 |
| Comparative Printing Plate E2 | 5 | 9,500 |
| Comparative Printing Plate F2 | 5 | 11,000 |

The base material for a lithographic printing plate according to the invention has a hydrophilic organic compound, which is ionically bonded to an ionic compound, fixed on the surface thereof, and therefore, such a lithographic printing plate can be provided that it has high sensitivity, is excellent in printing durability under severe printing conditions, causes no stain in printed matter, and has high hydrophilicity on the surface.

In a photosensitive lithographic printing plate comprising the base material described above having a photopolymerization initiator as the ionic compound and a polymerizable photosensitive layer containing a compound having a radical addition polymerizable ethylenically unsaturated bond, the photopolymerization initiator on the hydrophilic surface generates radicals by light, and thus the polymerization reaction in the vicinity of the interface between the photosensitive layer and the hydrophilic layer proceeds dominantly in comparison to the polymerization reaction of the entire layer, whereby sufficient printing durability can be obtained and a high sensitivity can be exhibited under exposure conditions of small irradiation energy.

The entire disclosure of each and every foreign patent application from which the benefit of foreign priority has been claimed in the present application is incorporated herein by reference, as if fully set forth herein.

While the invention has been described in detail and with reference to specific examples thereof, it will be apparent to skilled in the art that various changes and modifications can be made therein without departing from the spirit and scope thereof.

What is claimed is:

1. A base material for a lithographic printing plate comprising a support, a hydrophilic organic polymer compound that is chemically bonded to a surface of the support, and an ionic compound that is ionically bonded to the hydrophilic organic polymer compound.

2. The base material for a lithographic printing plate as claimed in claim 1, wherein the hydrophilic organic polymer compound is a hydrophilic chain polymer that is chemically bonded to the surface of the support at a terminal of the chain.

3. The base material for a lithographic printing plate as claimed in claim 1, wherein the hydrophilic organic polymer compound is a graft polymer having a main chain that is chemically bonded to the surface of the support and a hydrophilic polymer side chain.

4. The base material for a lithographic printing plate as claimed in claim 1, wherein the ionic compound is a cationic compound.

5. The base material for a lithographic printing plate as claimed in claim 1, wherein the ionic compound is an anionic compound.

6. The base material for a lithographic printing plate as claimed in claim 1, wherein the ionic compound is an infrared absorbing dye.

7. The base material for a lithographic printing plate as claimed in claim 1, wherein the ionic compound is a photopolymerization initiator.

8. A lithographic printing plate comprising: a base material which comprises a support, a hydrophilic organic polymer compound that is chemically bonded to a surface of the support, and an ionic compound that is ionically bonded to the hydrophilic organic polymer compound; and an image forming layer whose water-solubility changes with heat.

9. A lithographic printing plate comprising: a base material which comprises a support, a hydrophilic organic polymer compound that is chemically bonded to a surface of the support, and an ionic compound that is ionically bonded to the hydrophilic organic polymer compound; and an image forming layer whose alkali-solubility changes with heat.

10. A lithographic printing plate comprising: a base material which comprises a support, a hydrophilic organic polymer compound that is chemically bonded to a surface of the support, and a photopolymerization initiator that is ionically bonded to the hydrophilic organic polymer compound; and a polymerizable photosensitive layer containing a compound having a radical addition polymerizable ethylenically unsaturated bond.

* * * * *